United States Patent
Shin et al.

(10) Patent No.: US 11,329,044 B2
(45) Date of Patent: May 10, 2022

(54) INTEGRATED CIRCUIT DEVICE

(71) Applicant: SAMSUNG ELECTRONICS CO., LTD., Suwon-si (KR)

(72) Inventors: Hong-sik Shin, Seoul (KR); Heung-sik Park, Yongin-si (KR); Do-haing Lee, Seoul (KR); In-keun Lee, Hwaseong-si (KR); Seung-ho Chae, Hwaseong-si (KR); Ha-young Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/951,260

(22) Filed: Nov. 18, 2020

(65) Prior Publication Data

US 2021/0091081 A1 Mar. 25, 2021

Related U.S. Application Data

(63) Continuation of application No. 16/443,349, filed on Jun. 17, 2019, now Pat. No. 10,879,244.

(30) Foreign Application Priority Data

Sep. 5, 2018 (KR) .................. 10-2018-0106107

(51) Int. Cl.
| H01L 27/092 | (2006.01) |
| H01L 27/11 | (2006.01) |
| H01L 21/8238 | (2006.01) |
| H01L 29/78 | (2006.01) |
| H01L 29/66 | (2006.01) |

(52) U.S. Cl.
CPC ............ *H01L 27/0924* (2013.01); *H01L 21/823821* (2013.01); *H01L 27/1104* (2013.01); *H01L 29/66795* (2013.01); *H01L 29/785* (2013.01)

(58) Field of Classification Search
CPC ......... H01L 27/0924; H01L 21/823821; H01L 29/66795; H01L 29/785
See application file for complete search history.

(56) References Cited

U.S. PATENT DOCUMENTS

| 9,466,494 | B2 | 10/2016 | Wu et al. |
| 9,905,671 | B2 | 2/2018 | Cheng et al. |
| 9,935,168 | B2 | 4/2018 | Horak et al. |
| 2015/0093893 | A1 | 4/2015 | Tao et al. |
| 2016/0233298 | A1* | 8/2016 | Webb .............. H01L 21/823821 |
| 2017/0278747 | A1 | 9/2017 | Adusumilli et al. |
| 2018/0047808 | A1* | 2/2018 | Webb ................. H01L 27/0924 |
| 2018/0076086 | A1 | 3/2018 | Clevenger et al. |

FOREIGN PATENT DOCUMENTS

| KR | 2001-0066326 A | 7/2001 |
| KR | 2002-0009098 A | 2/2002 |
| KR | 10-0459816 B1 | 12/2004 |
| KR | 10-2010-0008942 A | 1/2010 |

* cited by examiner

*Primary Examiner* — Changhyun Yi
(74) *Attorney, Agent, or Firm* — Sughrue Mion, PLLC

(57) ABSTRACT

An integrated circuit device is provided. The integrated circuit device includes a fin-type active region that extends in a first direction on a substrate, a gate structure that intersects with the fin-type active region and extends in a second direction, perpendicular to the first direction, on the substrate, and a first contact structure that is disposed on the gate structure, and has a greater width at a top surface than a bottom surface thereof.

20 Claims, 20 Drawing Sheets

INTEGRATED CIRCUIT DEVICE

CROSS-REFERENCE TO THE RELATED APPLICATIONS

This application is a Continuation Application of U.S. application Ser. No. 16/443,349, filed on Jun. 17, 2019, in the United States Patent and Trademark Office, which claims priority from Korean Patent Application No. 10-2018-0106107, filed on Sep. 5, 2018, in the Korean Intellectual Property Office, the disclosures of which are incorporated herein in their entireties by reference.

BACKGROUND

The inventive concept relates to an integrated circuit device, and more particularly, to an integrated circuit device including a fin-type active region.

As electronic products tend to be light, thin, short, and small, demands for making integrated circuit devices highly integrated are increasing. As the integrated circuit devices are downscaled, short channel effects of transistors occur, and, accordingly, the reliabilities of the integrated circuit devices deteriorate. In order to reduce the short channel effects, the integrated circuit devices including fin-type active regions are suggested. However, as design rules are reduced, the sizes of the fin-type active regions, gate lines, and source/drain regions are also reduced.

SUMMARY

The inventive concept provides an integrated circuit device having a reduced size and high electrical performance.

According to an aspect of the inventive concept, there is provided an integrated circuit device which may include: a fin-type active region extending in a first direction on a substrate; a gate structure intersecting with the fin-type active region and extending in a second direction, perpendicular to the first direction, on the substrate; and a first contact structure disposed on the gate structure, and having a greater width at a top surface than a bottom surface thereof.

According to an aspect of the inventive concept, there is provided an integrated circuit device which may include: a plurality of fin-type active regions protruding from a top surface of a substrate and extending in a first direction on the substrate; a plurality of gate structures intersecting with the plurality of fin-type active regions and extending in a second direction, perpendicular to the first direction, on the substrate; a plurality of source/drain regions disposed in the fin-type active region at both sides of the plurality of gate structures; a first contact structure disposed on a first gate structure among the plurality of gate structures, and having a greater width at a top surface than a bottom surface thereof; and an insulating liner surrounding at least a portion of a sidewall of the first contact structure.

According to an aspect of the inventive concept, there is provided an integrated circuit device which may include: a fin-type active region protruding from a top surface of a substrate and extending in a first direction on the substrate; a gate structure intersecting with the fin-type active region and extending in a second direction, perpendicular to the first direction, on the substrate; an interlayer insulating layer disposed on the gate structure; a contact structure disposed in a contact hole, passing through the interlayer insulating layer, to be electrically connected to the gate structure, and having a greater width at a top surface than a bottom surface thereof; an insulating liner surrounding at least a portion of a side wall of the contact structure.

BRIEF DESCRIPTION OF THE DRAWINGS

Exemplary embodiments of the inventive concept will be more clearly understood from the following detailed description taken in conjunction with the accompanying drawings, in which.

DETAILED DESCRIPTION OF THE EMBODIMENTS

Exemplary embodiments of the spirit of the inventive concept will be described in detail with reference to the accompanying drawings. It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Figure 1:
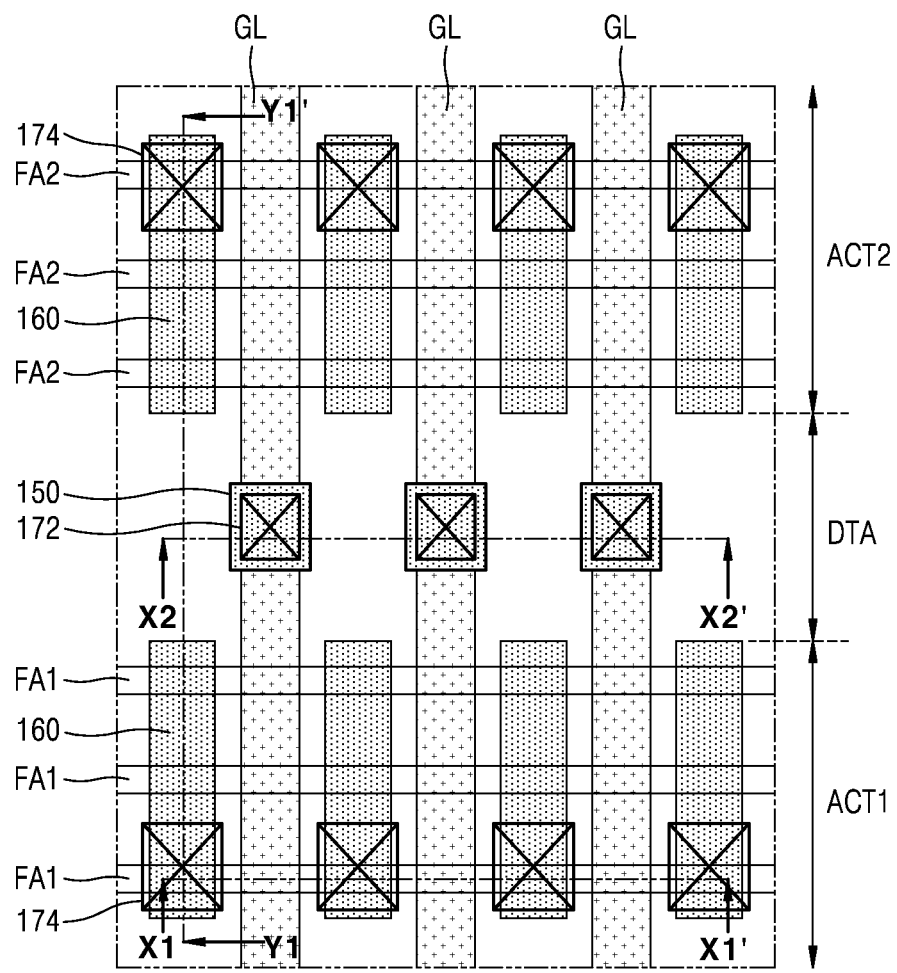
FIG. 1 is a layout diagram illustrating an integrated circuit device according to exemplary embodiments.
Figure 2:
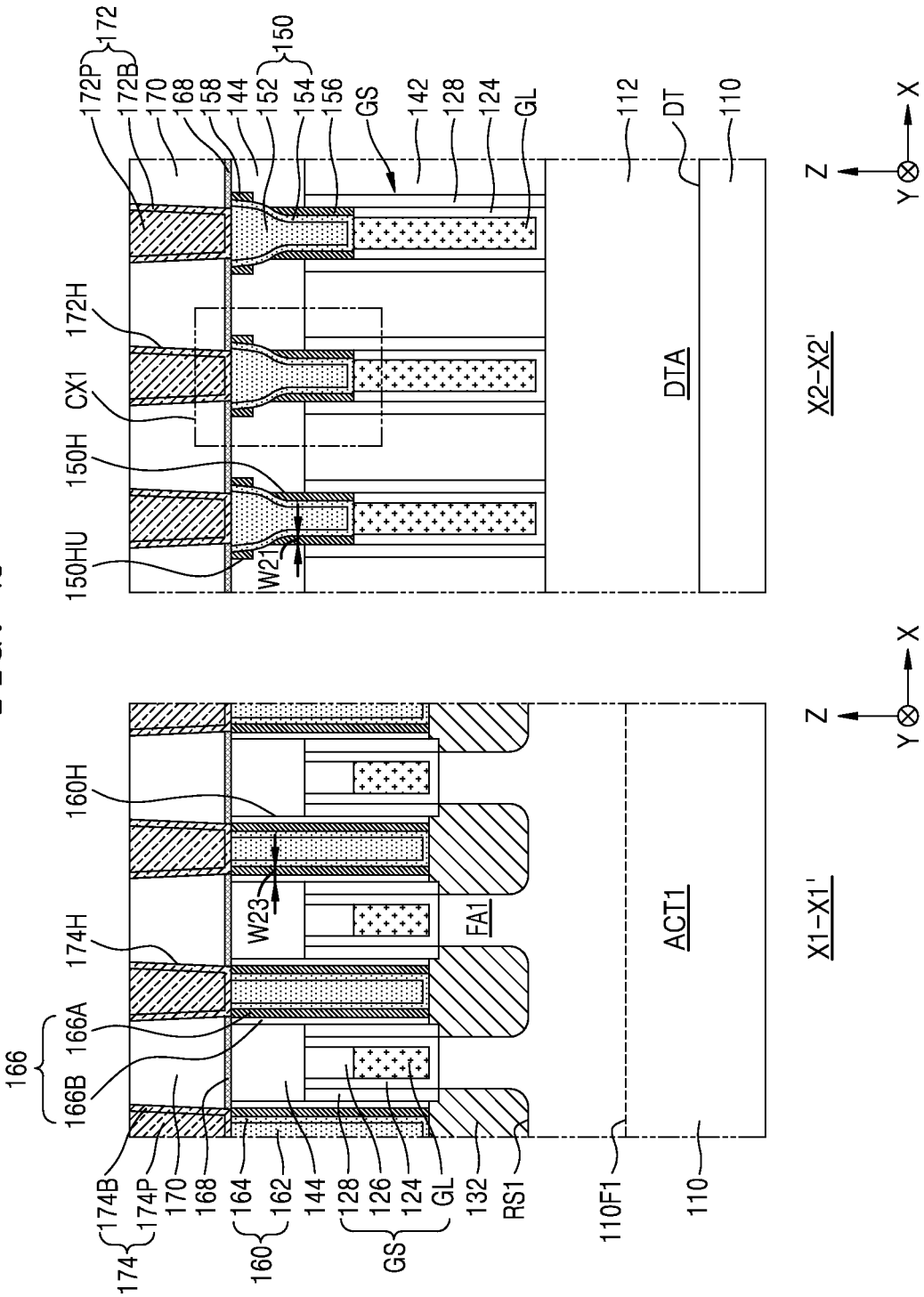
FIG. 2 is a cross-sectional view taken along the line X1-X1' and the line X2-X2' of FIG. 1.
Figure 3:
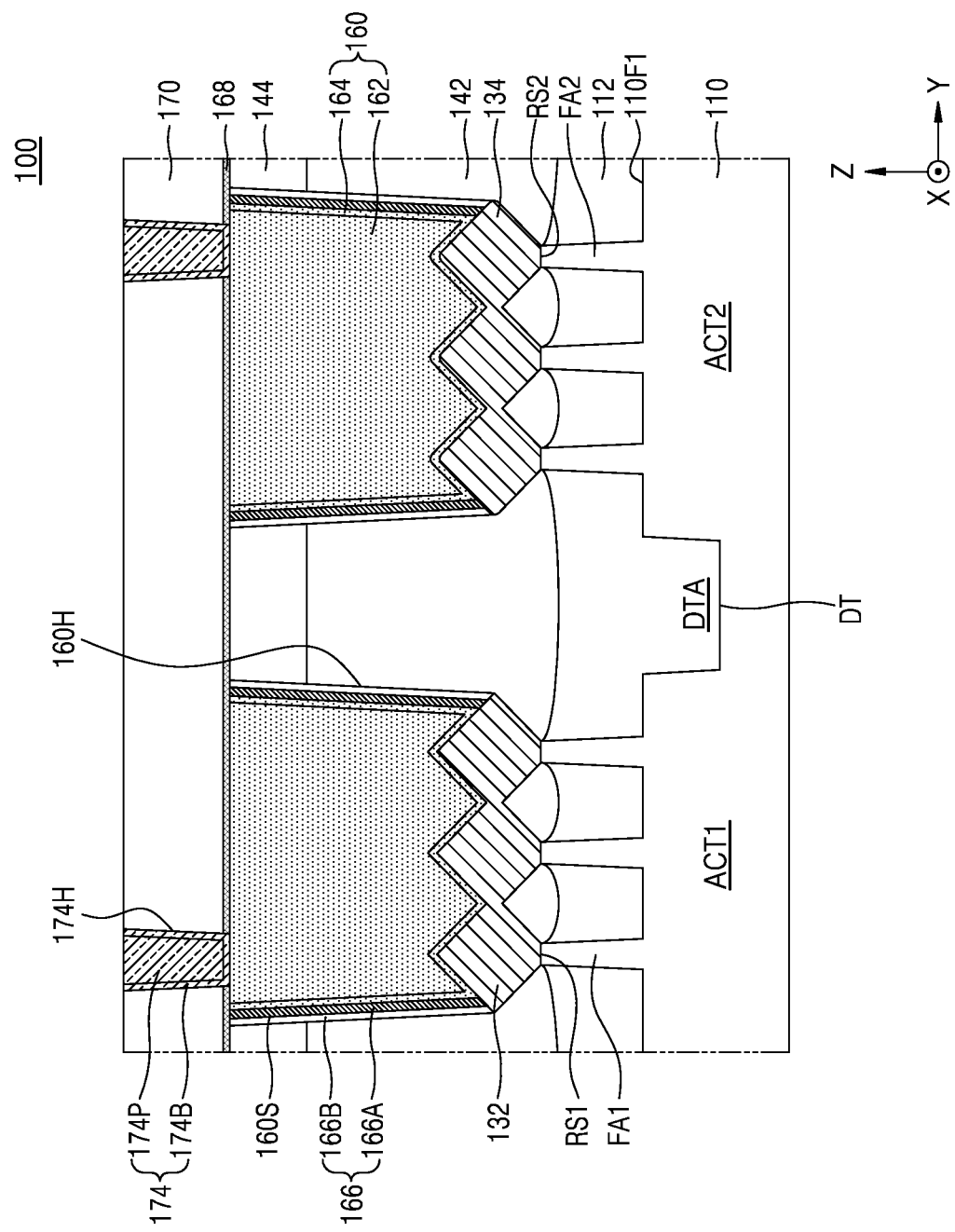
FIG. 3 is a cross-sectional view taken along the line Y1-Y1' of FIG. 1.
Figure 4:
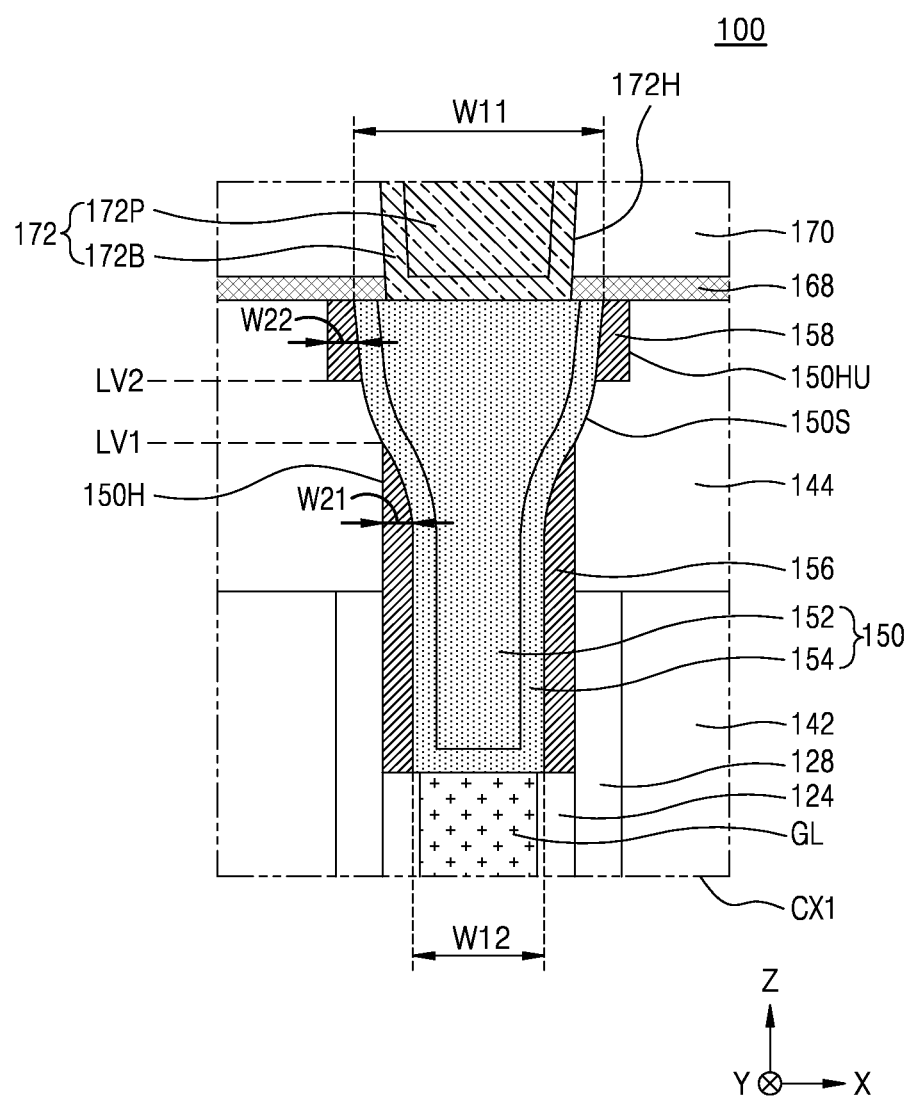
FIG. 4 is an enlarged view of the CX1 region of FIG. 2.

FIG. 1 is a layout diagram illustrating an integrated circuit device 100 according to exemplary embodiments. FIG. 2 is a cross-sectional view taken along the line X1-X1' and the line X2-X2' of FIG. 1. FIG. 3 is a cross-sectional view taken along the line Y1-Y1' of FIG. 1. FIG. 4 is an enlarged view of the CX1 region of FIG. 2. Partial components of the integrated circuit device 100 are omitted in FIG. 1.

Referring to FIGS. 1 to 4, a substrate 110 may include a first active region ACT1, a deep trench region DTA, and a second active region ACT2. The first active region ACT1 and the second active region ACT2 may be apart from each other with the deep trench region DTA therebetween.

In exemplary embodiments, the first active region ACT1 may be an active region for a p-type metal-oxide-semiconductor (PMOS) transistor, and the second active region ACT2 may be an active region for an n-type metal-oxide-semiconductor (NMOS) transistor. In other embodiments, the first active region ACT1 may be an active region for an NMOS transistor having a first threshold voltage, and the second active region ACT2 may be an active region for an NMOS transistor having a second threshold voltage, the second threshold voltage being different from the first threshold voltage.

In exemplary embodiments, the first active region ACT1, the second active region ACT2, and the deep trench region DTA may form standard cells performing a logical function. The standard cells may include various kinds of logic cells including a plurality of circuit devices such as a transistor and a register. The logic cells may form, for example, an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D flip-flop, a reset flip-flop, a master-slave flip-flop, and a latch.

On the first active region ACT1, a plurality of first fin-type active regions FA1 may protrude from a top surface 110F1 of the substrate 110, and may extend in a first direction (an X direction). On the second active region ACT2, a plurality of second fin-type active regions FA2 may protrude from the top surface 110F1 of the substrate 110, and may extend in the first direction (the X direction). Both side walls of each of the plurality of first fin-type active regions FA1 and both side walls of each of the plurality of second fin-type active regions FA2 may be covered with an isolation layer 112. In the deep trench region DTA, a deep trench DT may be formed to a predetermined depth from the top surface 110F1 of the substrate 110, and the isolation layer 112 may fill the inside of the deep trench DT.

In exemplary embodiments, the substrate 110 may include a Group W semiconductor such as Si or Ge, a Group IV-IV compound semiconductor such as SiGe or SiC, or a Group III-V compound semiconductor such as GaAs, InAs, or InP. The substrate 110 may include a conductive region, for example, a well doped with impurities or a structure doped with impurities.

A gate structure GS may extend in a second direction (a Y direction) to intersect with the plurality of first fin-type active regions FA1 and the plurality of second fin-type active regions FA2. The gate structure GS may include a gate electrode GL, a gate insulating layer 124, a gate capping layer 126, and a gate spacer 128.

The gate electrode GL may include doped polysilicon, metal, conductive metal nitride, conductive metal carbide, conductive metal silicide, or a combination of the above materials. For example, the gate electrode GL may be formed of aluminum (Al), copper (Cu), titanium (Ti), tantalum (Ta), tungsten (W), molybdenum (Mo), TaN, NiSi, CoSi, TiN, WN, TiAl, TiAlN, TaCN, TaC, TaSiN, or a combination of the above metals. However, the inventive concept is not limited thereto. In exemplary embodiments, the gate electrode GL may include a work function metal containing layer and a gap-fill metal layer. The work function metal containing layer may include at least one metal selected from Ti, W, ruthenium (Ru), niobium (Nb), Mo, hafnium (Hf), nickel (Ni), cobalt (Co), platinum (Pt), ytterbium (Yb), terbium (Tb), dysprosium (Dy), erbium (Er), and palladium (Pd). The gap-fill metal layer may include a W layer or an Al layer. In exemplary embodiments, the gate electrode GL may include a TiAlC/TiN/W stack structure, a TiN/TaN/TiAlC/TiN/W stack structure, or a TiN/TaN/TiN/TiAlC/TiN/W stack structure. However, the inventive concept is not limited thereto.

A gate insulating layer 124 may extend from a bottom surface and side walls of the gate electrode GL in the second direction. The gate insulating layer 124 may be disposed between the gate electrode GL and a fin-type active region FA and between the gate electrode GL and a top surface of the isolation layer 112. The gate insulating layer 124 may include silicon oxide, silicon oxy-nitride, a high-k dielectric material having a high dielectric constant higher than that of silicon oxide, or a combination of the above materials. The high-k dielectric layer may be formed of a metal oxide or a metal oxy-nitride. For example, the high-k dielectric layer that may be used as the gate insulating layer 124 may be formed of $HfO_2$, HfSiO, HfSiON, HfTaO, HfTiO, HfZrO, $ZrO_2$, $Al_2O_3$, or a combination of the above materials. However, the inventive concept is not limited thereto.

A gate capping layer 126 may be disposed on the gate electrode GL. The gate capping layer 126 covers a top surface of the gate electrode GL, and may extend in the second direction (the Y direction of FIG. 2). In exemplary embodiments, the gate capping layer 126 may include silicon nitride or silicon oxy-nitride.

The gate spacer 128 may be disposed on both side walls of the gate electrode GL and on both side walls of the gate capping layer 126. The gate spacer 128 may extend on the both side walls of the gate electrode GL in an extension direction of the gate electrode GL. A gate insulating layer 124 may be between the gate electrode GL and the gate spacer 128. In exemplary embodiments, the gate spacer 128 may include $SiO_x$, $SiN_x$, $SiO_xN_y$, $SiC_xN_y$, $SiO_xC_yN_z$, or a combination of the above materials.

In exemplary embodiments, the gate spacer 128 may include a plurality of layers formed of different materials. In FIG. 2, it is exemplarily illustrated that the gate spacer 128 includes a single layer. However, unlike this, the gate spacer 128 may include a first spacer layer (not shown), a second spacer layer (not shown), and a third spacer layer (not shown) that are sequentially stacked on the side walls of the gate electrode GL. In exemplary embodiments, the first spacer layer and the third spacer layer may include silicon nitride, silicon oxide, or silicon oxy-nitride. The second spacer layer may include an insulating material having a dielectric constant smaller than that of the first spacer layer. In some embodiments, the second spacer layer may include an air space.

On a first active region ACT1, a first recess region RS1 that extends to the insides of the first fin-type active regions FA1 at both sides of the gate structure GS may be formed. A first source/drain region 132 may be formed in the first recess region RS1. On a second active region ACT2, a second recess region RS2 that extends to the insides of the second fin-type active regions FA2 at both sides of the gate structure GS may be formed. A second source/drain region 134 may be formed in the second recess region RS2.

The first source/drain region 132 may have a polygonal cross-section having a plurality of inclined side walls (not shown). As illustrated in FIG. 3, side walls of the first source/drain region 132 that are connected to one of the plurality of first fin-type active regions FA1 may be connected to side walls of the first source/drain region 132 that are connected to a first fin-type active region FA1 adjacent to the one of the plurality of first fin-type active regions FA1. However, the inventive concept is not limited thereto.

The first source/drain region 132 may include a doped SiGe layer, a doped Ge layer, a doped SiC layer, or a doped InGaAs layer. However, the inventive concept is not limited thereto. The first recess region RS1 is formed by removing parts of the first fin-type active regions FA1 at both sides of the gate structure GS, and the first source/drain region 132 may be formed by growing a semiconductor layer that fills the inside of the first recess region RS1 by an epitaxy growth process.

In exemplary embodiments, when the first fin-type active regions FA1 are active regions for a PMOS transistor, the first source/drain region 132 may include doped SiGe and, when the first fin-type active regions FA1 are active regions for an NMOS transistor, the first source/drain region 132 may include doped SiC. However, the spirit of the inventive concept is not limited thereto.

In exemplary embodiments, the first source/drain region 132 may include a plurality of semiconductor layers having different compositions. For example, the first source/drain region 132 may include a lower semiconductor layer (not shown), an upper semiconductor layer (not shown), and a capping semiconductor layer (not shown) that sequentially fill the recess region RS1. For example, the lower semiconductor layer, the upper semiconductor layer, and the capping semiconductor layer include SiGe and Si and Ge with different amounts.

The second source/drain region 134 may include the doped SiGe layer, the doped Ge layer, the doped SiC layer, or the doped InGaAs layer. However, the inventive concept is not limited thereto. The second recess region RS2 is formed by removing parts of the second fin-type active regions FA2 at both sides of the gate structure GS and the second source/drain region 134 may be formed by growing a semiconductor layer that fills the inside of the second recess region RS2 by an epitaxy growth process.

In exemplary embodiments, the second source/drain region 134 may include a plurality of semiconductor layers having different compositions. For example, the second source/drain region 134 may include a lower semiconductor layer (not shown), an upper semiconductor layer (not shown), and a capping semiconductor layer (not shown) that sequentially fill the second recess region RS2. For example, the lower semiconductor layer, the upper semiconductor layer, and the capping semiconductor layer include SiC and Si and C with different amounts.

Although not shown, an etch stop layer (not shown) may be further formed on the side walls of the first source/drain region 132, side walls of the second source/drain region 134, and the top surface of the isolation layer 112. The etch stop layer may include at least one of silicon nitride, silicon oxy-nitride, silicon oxycarbonitride, and silicon oxide.

An inter-gate insulating layer 142 that covers the first source/drain region 132 and the second source/drain region 134 may be formed between the gate structure GS. A first interlayer insulating layer 144 may be formed on the gate structure GS and the inter-gate insulating layer 142. The inter-gate insulating layer 142 and the first interlayer insulating layer 144 may include at least one of silicon oxy-nitride, silicon oxycarbonitride, and silicon oxide.

A first contact structure 150, that passes through the first interlayer insulating layer 144 and is connected to the gate electrode GL, may be disposed on the gate structure GS. A first contact hole 150H passes through the first interlayer insulating layer 144 and extends to the inside of the gate structure GS. The first contact structure 150 may be disposed in the first contact hole 150H. The first contact structure 150 may include a first contact plug 152 and a first conductive barrier 154 that surrounds a bottom surface and side walls of the first contact plug 152.

As exemplarily illustrated in FIG. 4, a width of an upper portion of the first contact hole 150H may be greater than a width of a lower portion of the first contact hole 150H, and the first contact hole 150H may have an expanded upper region 150HU. A first width W11 of the first contact hole 150H at a top surface thereof may be greater than a second width W12 of the first contact hole 150H at a bottom surface thereof. A side wall 150S of the first contact structure 150 may have a gradually rounded profile without kinks or a step 150HK (refer to FIG. 16).

A lower insulating liner 156 and an upper insulating liner 158 may be apart from each other on an inner wall of the first contact hole 150H. The lower insulating liner 156 surrounds a lower portion of the side wall 150S of the first contact structure 150. The upper insulating liner 158 may be apart from the lower insulating liner 156 in a vertical direction and may surround an upper portion of the side wall 150S of the first contact structure 150.

The lower insulating liner 156 may be disposed on an inner wall (that is, a side wall of the gate spacer 128 that faces the gate electrode GL) of the gate spacer 128. The lower insulating liner 156 has a third width W21 in the first direction (the X direction). The third width W21 of the lower insulating liner 156 may gradually decrease from a top surface of the gate spacer 128 upward. For example, an upper end of the lower insulating liner 156 may be tapered.

The upper insulating liner 158 may be disposed in the expanded upper region 150HU of the first contact hole 150H, may be apart from the lower insulating liner 156 in a vertical direction (a Z direction), and may surround the upper portion of the side wall 150S of the first contact structure 150. A top surface of the upper insulating liner 158 is at the same level as a top surface of the first contact structure 150. A bottom surface of the upper insulating liner 158 may be at the same level as a bottom portion of the expanded upper region 150HU. The upper insulating liner 158 may have a fourth width W22 in the first direction (the X direction). In FIG. 4, the fourth width W22 of the upper insulating liner 158 is exemplarily illustrated as gradually decreasing from the bottom surface of the upper insulating liner 158 toward the top surface of the upper insulating liner 158. However, the inventive concept is not limited thereto. Unlike in FIG. 4, the upper insulating liner 158 may have substantially the same fourth width W22 in an entire region of the upper insulating liner 158.

A part of the side wall 150S of the first contact structure 150, positioned at a level higher than a level LV1 of a top surface of the lower insulating liner 156 and lower than a level LV2 of the bottom surface of the upper insulating liner 158, may be surrounded by the first interlayer insulating layer 144.

In an exemplary manufacturing process of forming the first contact structure 150, after the first contact hole 150H that exposes the top surface of the gate electrode GL is formed, the expanded upper region 150HU may be formed by laterally expanding the first contact hole 150H by a predetermined depth from the top surface of the first contact hole 150H. Then, an insulating liner layer 166P (refer to FIG. 17) is formed on the inner wall of the first contact hole 150H, and a side wall rounding process is performed on the insulating liner layer 166P so that the first contact hole 150H having a gradually-sloped side wall profile may be formed. Then, the first contact structure 150 may be formed in the first contact hole 150H. A part of the insulating liner layer 166P is removed by the side wall rounding process. A part of the insulating liner layer 166P that resides in the expanded upper region 150HU may be referred to as the upper insulating liner 158, and a part of the insulating liner layer 166P that resides in the first contact hole 150H at a level lower than that of the expanded upper region 150HU may be referred to as the lower insulating liner 156.

In general, since a width of the first contact structure 150 is small and a height of the first contact structure 150 is large, in a process of filling the inside of the first contact hole 150H with a metal material, the metal material may not be completely filled. In such a case, a void may be formed in the first contact structure 150 and resistance of the first contact structure 150 increases, and thus, an electrical characteristic of the integrated circuit device 100 may deteriorate. However, according to the above-described exemplary embodiments, the expanded upper region 150HU is formed and the side wall rounding process is performed on the insulating liner layer 166P so that the first contact structure 150 having an increased upper width and the gradually-sloped side wall profile may be formed.

A second contact structure 160 may be disposed on the first source/drain region 132 and the second source/drain region 134. A second contact hole 160H passes through the first interlayer insulating layer 144 and the inter-gate insulating layer 142, and may expose top surfaces of the first source/drain region 132 and the second source/drain region 134. The second contact structure 160 may be disposed in the second contact hole 160H.

The second contact structure 160 includes a second contact plug 162 and a second conductive barrier 164. The second contact plug 162 and the second conductive barrier 164 may include the same materials included in the first contact plug 152 and the first conductive barrier 154, respectively. A top surface of the second contact structure 160 may be disposed at the same level as that the top surface of the first contact structure 150.

A side wall 160S of the second contact structure 160 may be surrounded by a liner structure 166. The liner structure 166 may include a first insulating liner 166A and a second insulating liner 166B. The first insulating liner 166A is disposed on the side wall 160S of the second contact structure 160, and the second insulating liner 166B may surround a side wall of the first insulating liner 166A. The second insulating liner 166B may contact the inter-gate insulating layer 142 and the first interlayer insulating layer 144. The liner structure 166 is disposed on a side wall of the second contact hole 160H, and may not cover a part of the top surfaces of the first source/drain region 132 and the second source/drain region 134 that are exposed by the second contact hole 160H. A fifth width W23 of the liner structure 166 in the first direction may be greater than a third width W21 of the lower insulating liner 156 in the first direction.

In manufacturing processes according to exemplary embodiments, the second contact hole 160H that exposes the top surfaces of the first source/drain region 132 and the second source/drain region 134 is formed. Then, after forming the second insulating liner 166B on an inner wall of the second contact hole 160H, a buried insulating layer 320 (refer to FIG. 13) that fills a residual portion of the second contact hole 160H may be formed. Then, the first contact hole 150H that exposes the top surface of the gate electrode GL is formed by removing parts of the buried insulating layer 320 and the first interlayer insulating layer 144, a pull-back process is performed on the buried insulating layer 320, and the upper portion of the first contact hole 150H is expanded by using a pulled-back buried insulating layer 320E as an etching mask so that the expanded upper region 150HU may be formed. Then, the buried insulating layer 320 is removed, the insulating liner layer 166P (refer to FIG. 17) is formed on the side walls of the first contact hole 150H and the second contact hole 160H, and the side wall rounding process is performed on the insulating liner layer 166P so that the first contact hole 150H having the gradually-sloped side wall profile may be formed. Then, the first contact structure 150 and the second contact structure 160 that respectively fill the first contact hole 150H and the second contact hole 160H may be formed.

As exemplarily illustrated in FIG. 4, a lower portion of the side wall 150S of the first contact structure 150 is surrounded by the lower insulating liner 156 and may have the second width W12 at the same level as that of a bottom surface of the first contact structure 150. The upper portion of the side wall 150S of the first contact structure 150 is surrounded by an upper insulating liner 158 disposed in the expanded upper region 150HU and may have the first width W11 greater than the second width W12 at the same level as that of the top surface of the first contact structure 150. By performing the above-described side wall rounding process, the side wall 150S of the first contact structure 150 may have the profile gradually connected or smoothly connected from the lower portion toward the upper portion. As the upper portion of the side wall 150S of the first contact structure 150 expands, it is possible to prevent a void from being formed in a process of filling a metal material.

An etch stop layer 168 may be formed on the first contact structure 150, the second contact structure 160, and the first interlayer insulating layer 144. A second interlayer insulating layer 170 may be formed on the etch stop layer 168.

A first via structure 172 may be disposed to pass through the etch stop layer 168 and the second interlayer insulating layer 170 and to be connected to the first contact structure 150. A second via structure 174 may be disposed to pass through the etch stop layer 168 and the second interlayer insulating layer 170 and to be connected to the second contact structure 160. The first via structure 172 and the second via structure 174 may respectively include via conductive layers 172P and 174P and via barrier layers 172B and 174B that respectively surround side walls and bottom surfaces of the via conductive layers 172P and 174P.

According to the above-described exemplary embodiments, the first contact structure 150 connected to the gate structure GS has the gradually connected side wall profile, and a width of the upper portion of the first contact structure 150 may be greater than a width of the lower portion of the first contact structure 150. Therefore, it is possible to prevent a void from being formed in the process of filling the metal material to form the first contact structure 150, and the integrated circuit device 100A including the first contact structure 150 may have a high electrical characteristic.

Figure 5:
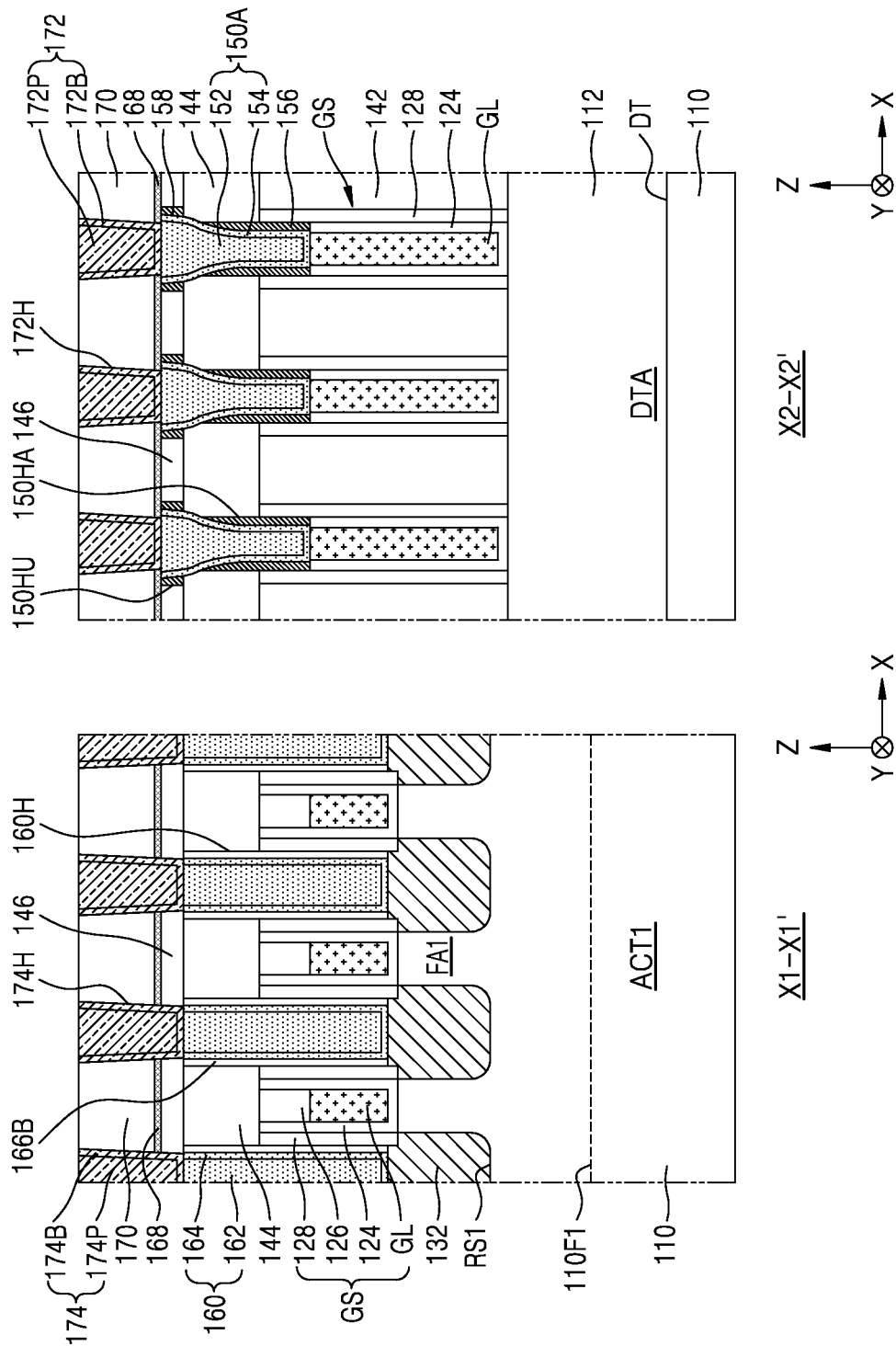
FIG. 5 is a cross-sectional view illustrating an integrated circuit device according to exemplary embodiments.

FIG. 5 is a cross-sectional view illustrating an integrated circuit device 100A according to exemplary embodiments. In FIG. 5, the same reference numerals as those of FIGS. 1 to 4 denote the same components.

Referring to FIG. 5, a third interlayer insulating layer 146 is further formed between the first interlayer insulating layer 144 and the etch stop layer 168. Further, a first contact hole 150HA passes through the third interlayer insulating layer 146 and the first interlayer insulating layer 144, and may expose the top surface of the gate electrode GL. A first contact structure 150A disposed in the first contact hole 150HA may have a top surface disposed at a higher level than that of a top surface of the second contact structure 160.

The bottom portion of the expanded upper region 150HU of the first contact hole 150HA may be defined by a top surface of the first interlayer insulating layer 144 and side walls of the third interlayer insulating layer 146. The upper insulating inner 158 may be disposed on the inner wall of the expanded upper region 150HU. The top surface of the upper insulating liner 158 is disposed at the same level as that of the top surface of the third interlayer insulating layer 146. The bottom surface of the upper insulating liner 158 may be disposed at the same level as that of the bottom surface of the third interlayer insulating layer 146. A side wall of the upper insulating liner 158 is surrounded by the third interlayer insulating layer 146, and a side wall of the lower insulating liner 156 may be surrounded by the first interlayer insulating layer 144.

The second contact structure 160 may be surrounded by the second insulating liner 166B and the first insulating liner 166A described in FIGS. 1 to 4 may be omitted.

In exemplary manufacturing processes, after forming the second contact hole 160H that exposes the top surfaces of the first source/drain region 132 and the second source/drain region 134 and forming the second insulating liner 166B on the inner wall of the second contact hole 160H, the second contact structure 160 that fills a residual portion of the second contact hole 160H may be formed. Then, the third interlayer insulating layer 146 and the buried insulating layer 320 (refer to FIG. 13) may be sequentially formed on the second contact structure 160 and the first interlayer insulating layer 144. Then, parts of the buried insulating layer 320, the third interlayer insulating layer 146, and the first interlayer insulating layer 144 are removed so that the first contact hole 150HA that exposes the top surface of the gate electrode GL is formed, the pull-back process is performed on the buried insulating layer 320, and the upper portion of the first contact hole 150HA is expanded by using the pulled-back buried insulating layer 320E as the etching mask so that the expanded upper region 150HU may be formed. Then, the buried insulating layer 320 is removed, the insulating liner layer 166P (refer to FIG. 17) is formed on the side wall of the first contact hole 150HA, and the side wall rounding process is performed on the insulating liner layer 166P so that the first contact hole 150HA having the gradually-sloped side wall profile may be formed. Then, the first contact structure 150A that fills the first contact hole 150HA may be formed.

According to the above-described exemplary embodiments, the first contact structure 150A has a side wall profile gradually connected to the gate structure GS, and a width of an upper portion of the first contact structure 150A may be greater than a width of a lower portion of the first contact structure 150A. Therefore, it is possible to prevent a void from being formed in the process of filling the metal material to form the first contact structure 150A, and the integrated circuit device 100A including the first contact structure 150A may have a high electrical characteristic.

Figure 6:
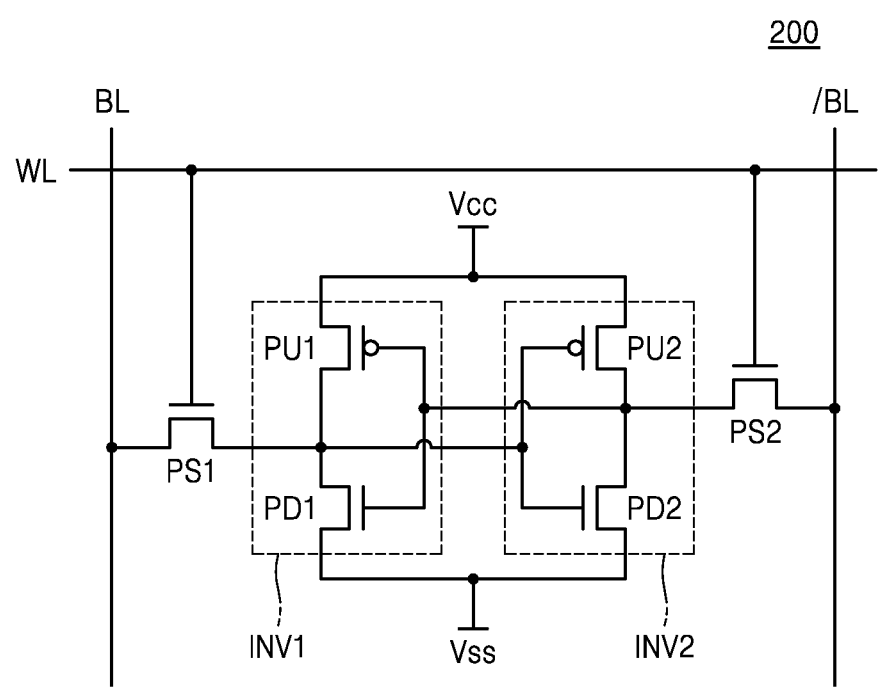
FIG. 6 is an equivalent circuit diagram illustrating an integrated circuit device according to exemplary embodiments.

FIG. 6 is an equivalent circuit diagram illustrating an integrated circuit device 200 according to exemplary embodiments. In FIG. 6, a circuit diagram of a 6 T static random access memory (SRAM) cell including six transistors is illustrated.

Referring to FIG. 6, the integrated circuit device 200 may include a pair of inverters INV1 and INV2 connected between a power node Vcc and a ground node Vss in parallel and a first pass transistor PS1 and a second pass transistor PS2 that are respectively connected to output nodes of the inverters INV1 and INV2. The first pass transistor PS1 and the second pass transistor PS2 may be respectively connected to a bit line BL and a complementary bit line/BL. Gates of the first pass transistor PS1 and the second pass transistor PS2 may be connected to a word line WL.

The first inverter INV1 includes a first pull-up transistor PU1 and a first pull-down transistor PD1 that are serially connected to each other, and the second inverter INV2 includes a second pull-up transistor PU2 and a second pull-down transistor PD2 that are serially connected to each other. The first pull-up transistor PU1 and the second pull-up transistor PU2 may be formed of PMOS transistors, and the first pull-down transistor PD1 and the second pull-down transistor PD2 may be formed of NMOS transistors.

In order for the first inverter INV1 and the second inverter INV2 to form a latch circuit, an input node of the first inverter INV1 is connected to an output node of the second inverter INV2 and an input node of the second inverter INV2 may be connected to an output node of the first inverter INV1.

Figure 7:
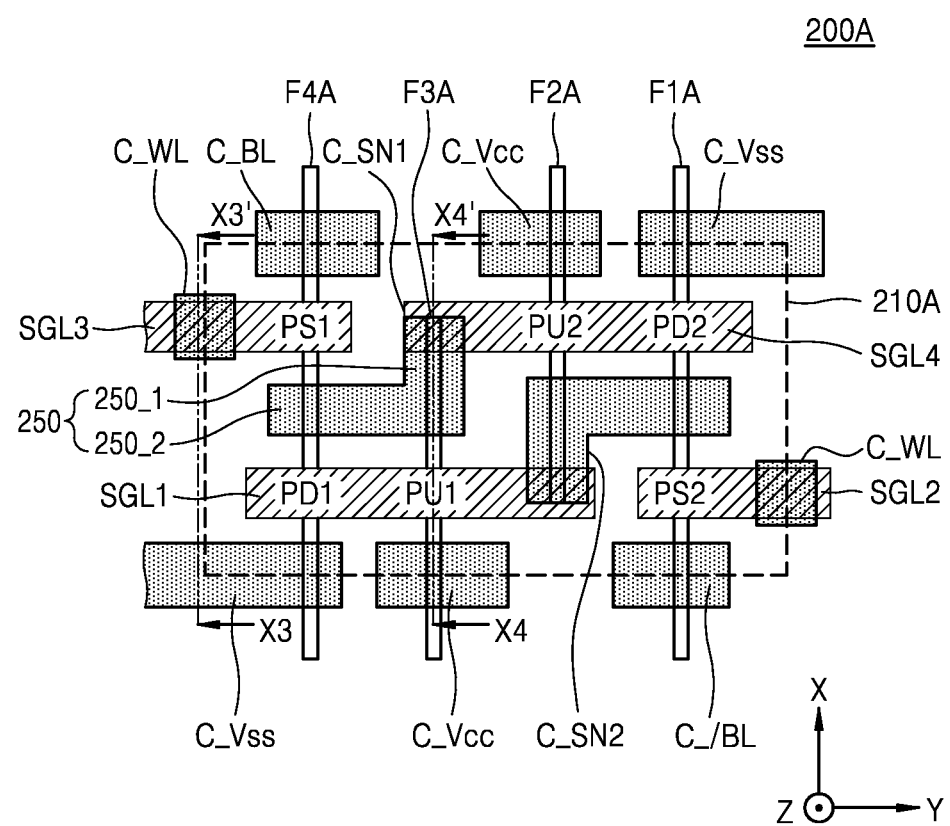
FIG. 7 is a layout diagram of an integrated circuit device according to exemplary embodiments.
Figure 8:
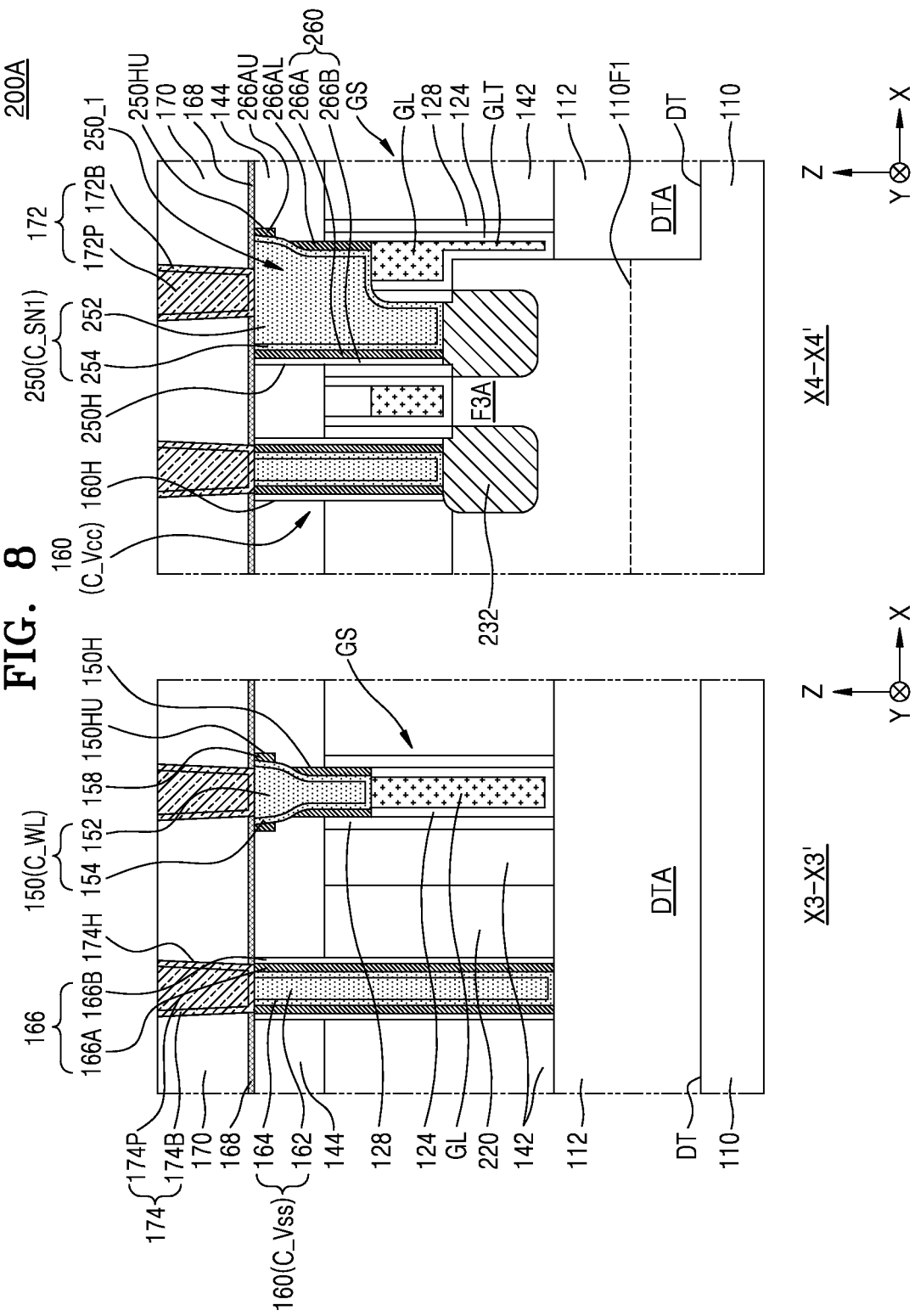
FIG. 8 is a cross-sectional view taken along the line X3-X3' and the line X4-X4' of FIG. 7.

FIG. 7 is a layout diagram of an integrated circuit device 200A according to exemplary embodiments. FIG. 8 is a cross-sectional view taken along the line X3-X3' and the line X4-X4' of FIG. 7. In FIGS. 7 and 8, the same reference numerals as those of FIGS. 1 to 6 denote the same components.

Referring to FIGS. 7 and 8, the integrated circuit device 200A may include an SRAM cell 210A disposed on a substrate 110. The SRAM cell 210A may include six finFETs.

The SRAM cell 210A includes a plurality of fin-type active regions F1A, F2A, F3A, and F4A that are parallel with each other and extend in the first direction (the X direction). The plurality of fin-type active regions F1A, F2A, F3A, and F4A may protrude from a top surface of the substrate 110 in the Z direction.

In addition, the SRAM cell 210A may include a plurality of gate lines SGL1, SGL2, SGL3, and SGL4 that extend to cover both side walls and a top surface of the plurality of fin-type active regions F1A, F2A, F3A, and F4A in parallel in the second direction (the Y direction) that intersects with the first direction (the X direction). The plurality of gate lines SGL1, SGL2, SGL3, and SGL4 may have a similar characteristic to that of the gate line GL described with reference to FIGS. 1 to 4. Among the plurality of gate lines SGL1, SGL2, SGL3, and SGL4, between two adjacent gate lines disposed on a straight line in the second direction (the Y direction), a gate cut insulating layer 220 may be disposed.

The first pull-up transistor PU1, the first pull-down transistor PD1, the first pass transistor PS1, the second pull-up transistor PU2, the second pull-down transistor PD2, and the second pass transistor PS2 that form the SRAM cell 210A may be implemented by fin-type transistors. In particular, the first pull-up transistor PU1 and the second pull-up transistor PU2 may be formed of PMOS transistors, and the first pull-down transistor PD1, the second pull-down transistor PD2, the first pass transistor PS1, and the second pass transistor PS2 may be formed of NMOS transistors.

Transistors may be formed at intersections between the plurality of fin-type active regions F1A, F2A, F3A, and F4A that extend in the X direction and the plurality of gate lines SGL1, SGL2, SGL3, and SGL4 that extend in the Y direction.

The first pass transistor PS1 is formed at an intersection between the fin-type active region F4A and the gate line SGL3, and the second pass transistor PS2 may be formed at an intersection between the fin-type active region F1A and the gate line SGL2. The first pull-down transistor PD1 is formed at an intersection between the fin-type active region F4A, and the gate line SGL1 and the second pull-down transistor PD2 may be formed at an intersection between the fin-type active region F1A and the gate line SGL4. The first pull-up transistor PU1 is formed at an intersection between the fin-type active region F3A, and the gate line SGL1 and the second pull-up transistor PU2 may be formed at an intersection between the fin-type active region F2A and the gate line SGL4.

As exemplarily illustrated in FIG. 7, various contact structures may be disposed in the SRAM cell 210A. In detail, one word line contact C_WL may be connected to the gate line SGL3 of the first pass transistor PS1, and the other word line contact C_WL may be connected to the gate line SGL2 of the second pass transistor PS2. A bit line contact C_BL may be connected to a drain of the first pass transistor PS1, and a complementary bit line contact C_/BL may be connected to a drain of the second pass transistor PS2. One power node contact C_Vcc may be connected to a source of the first pull-up transistor PU1, and the other power node contact C_Vcc may be connected to a source of the second pull-up transistor PU2. One ground node contact C_Vss may be connected to a source of the first pull-down transistor PD1, and the other ground node contact C_Vss may be connected to a source of the second pull-down transistor PD2. A first storage node contact C_SN1 may be connected to a source of the first pass transistor PS1 and drains of the first pull-up transistor PU1 and the first pull-down transistor PD1. A second storage node contact C_SN2 may be connected to a source of the second pass transistor PS2 and drains of the second pull-up transistor PU2 and the second pull-down transistor PD2.

The word line contact C_WL may include the first contact structure 150. The first contact structure 150 may be electrically connected to the gate lines SGL2 and SGL3. The lower insulating liner 156 and the upper insulating liner 158 are apart from each other in the vertical direction, and may surround a side wall of the first contact structure 150.

The power node contact C_Vcc, the ground node contact C_Vss, the bit line contact C_BL, and the complementary bit line contact C_/BL may include the second contact structure 160. The power node contact C_Vcc, the ground node contact C_Vss, the bit line contact C_BL, and the complementary bit line contact C_/BL may be disposed on a source/drain region 232 that extends from one of the plurality of fin-type active regions F1A, F2A, F3A, and F4A. Although not shown, an intermediate layer (not shown) formed of at least one of tungsten (W), cobalt (Co), nickel (Ni), ruthenium (Ru), copper (Cu), aluminum (Al), a silicide of the above metals, and an alloy of the above metals may be further formed between the source/drain region 232 and the second contact structure 160.

The first storage node contact C_SN1 and the second storage node contact C_SN2 may include a third contact structure 250. The third contact structure 250 may be formed in the third contact hole 250H, and may include a third contact plug 252 and a third conductive barrier 254.

The third contact structure 250 may include a first portion 250_1 that extends in the first direction (the X direction) and a second portion 250_2 that extends in the second direction (the Y direction). The third contact structure 250 may have an L-shaped horizontal cross-section. The first portion 250_1 may vertically overlap the gate line GL, and the second portion 250_2 may vertically overlap the source/drain region 232 adjacent to the gate line GL. As exemplarily illustrated in FIGS. 7 and 8, the second portion 250_2 may be disposed on the source/drain region 232 that extends from two adjacent fin-type active regions among the plurality of fin-type active regions F1A, F2A, F3A, and F4A. The first portion 250_1 of the third contact structure 250 may be asymmetrical with respect to the first direction (the X direction). A side wall of the first portion 250_1 of the third contact structure 250 may have a gradually extending side wall profile.

A third contact hole 250H may expose top surfaces of the gate lines SGL1 and SGL4 and a top surface of the source/drain region 232 adjacent to the top surfaces of the gate lines SGL1 and SGL4. As illustrated in FIG. 8, a part of the gate line GL exposed by the third contact hole 250H may have a tail GLT that extends in the vertical direction (the Z direction) along a profile of a side wall of the fin-type active region F3A, and the tail GLT may be disposed on the isolation layer 112. However, the inventive concept is not limited thereto.

A liner structure 260 may be disposed on an inner wall of the third contact hole 250H, and the third contact structure 250 may be disposed on the liner structure 260 to fill the inside of the third contact hole 250H. The liner structure 260 may include a first insulating liner 266A and a second insulating liner 266B. In the first insulating liner 266A, a part disposed on an inner wall of an expanded upper region 250HU may be referred to as an upper insulating liner 266AU, and a part apart from the upper insulating liner 266AU in a vertical direction and disposed on the gate electrode GL may be referred to as a lower insulating liner 266AL.

In general, since widths of the first contact structure 150 and a first portion 250_1 of the third contact structure 250 are relatively small and heights of the first contact structure 150 and a first portion 250_1 of the third contact structure 250 are relatively large, in a process of filling the insides of the first contact hole 150H and a third contact hole 250H with a metal material, the insides of the first contact hole 150H and a third contact hole 250H may not be completely filled. In such a case, a void may be formed in the first contact structure 150 and the first portion 250_1 of the third contact structure 250 and resistance of the first contact structure 150 and the first portion 250_1 of the third contact structure 250 increases so that an electrical characteristic of the integrated circuit device 200A may deteriorate.

However, according to the above-described exemplary embodiments, as the expanded upper regions 150HU and 250HU are formed and the side wall rounding process is performed on the first contact hole 150H and the third contact hole 250H, the first contact structure 150 and the first portion 250_1 of the third contact structure 250 having increased upper widths and gradually-sloped side wall profiles may be formed. Therefore, it is possible to prevent a void from being formed in the process of filling the metal material to form the first contact structure 150 and the first portion 250_1 of the third contact structure 250, and the integrated circuit device 200A may have a high electrical characteristic.

FIGS. 9 to 20 are cross-sectional views illustrating a method of manufacturing an integrated circuit device 100 according to exemplary embodiments.

In FIGS. 9 to 20, the same reference numerals as those of FIGS. 1 to 8 denote the same components. In addition, for convenience sake, in FIGS. 9 to 20, only an example in which the first fin-type active region FA1 and the first source/drain region 132 are formed on the first active region ACT1 is illustrated. However, the second fin-type active region FA2 and the second source/drain region 134 may be formed on the second active region ACT2 by the same method as a method of forming the first fin-type active region FA1 and the first source/drain region 132 on the first active region ACT1.

Figure 9:
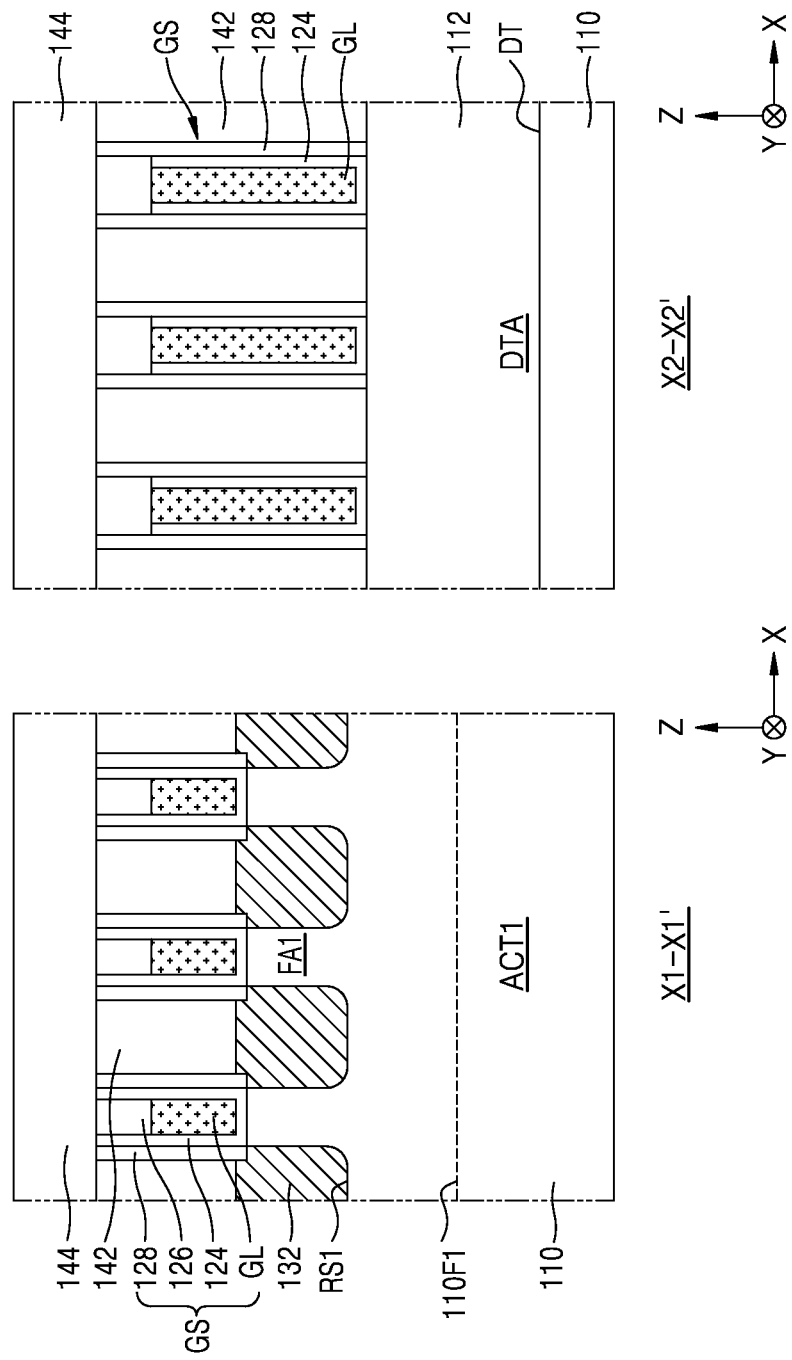
FIGS. 9 to 20 are cross-sectional views illustrating a method of manufacturing an integrated circuit device according to exemplary embodiments.

Referring to FIG. 9, the first fin-type active region FA1 that protrudes from the top surface 110F1 of the substrate 110 in a vertical direction and extends in the first direction (the X direction) may be formed by etching a partial region of the first active region ACT1 of the substrate 110.

The isolation layer 112 that covers the both side walls of the first fin-type active region FA1 may be formed on the substrate 110. Although not shown, an interface layer (not shown) that conformally covers the side walls of the first fin-type active region FA1 may be further formed between the isolation layer 112 and the first fin-type active region FA1.

Then, a stacked structure of a sacrifice gate insulating layer pattern (not shown), a sacrifice gate (not shown), and a hard mask pattern (not shown) is formed on the substrate 110 and the gate spacer 128 may be formed on a side wall of the stacked structure. The gate spacer 128 may include silicon nitride. However, the inventive concept is not limited thereto.

Then, a first recess region RS1 may be formed by etching a part of the first fin-type active region FA1 at both sides of the stacked structure and the gate spacer 128. In exemplary embodiments, a process of forming the first recess region RS1 may include a dry etching process, a wet etching process, or a combination of the above processes.

In the process of forming the first recess region RS1, a part of the first fin-type active region FA1 under the gate spacer 128 is further removed so that the first recess region RS1 may expand laterally and a part of the first recess region RS1 may vertically overlap the gate spacer 128.

Then, the first source/drain region 132 may be formed on an inner wall of the first recess region RS1. The first source/drain region 132 may be formed by an epitaxy growth process by using a side wall of the first fin-type active region FA1 and a top surface of the substrate 110 that are exposed at the inner wall of the first recess region RS1 as seed layers. The epitaxy growth process may be a chemical vapor deposition (CVD) process such as a vapor-phase epitaxy (VPE) process or an ultra-high vacuum chemical vapor deposition (UHV-CVD) process, molecular beam epitaxy, or a combination of the above processes. In the epitaxy growth process, the first source/drain region 132 may be formed at a process pressure of about 50 Torr to about 400 Torr by using a liquid or vapor precursor as a precursor required for forming the first source/drain region 132. In the epitaxy growth process of forming the first source/drain region 132, first impurities may be in-situ doped in the first source/drain region 132.

The first source/drain region 132 may include a lower semiconductor layer (not shown), an upper semiconductor layer (not shown), and a capping semiconductor layer (not shown). In respective processes of forming the lower semiconductor layer, the upper semiconductor layer, and the capping semiconductor layer, different feeding concentrations of precursors and different doping concentrations of impurities may be used.

Then, an insulating layer (not shown) that covers the stacked structure, the gate spacer 128, and the first source/drain region 132 is formed on the substrate 110, and the insulating layer is planarized until top surfaces of the stacked structure and the gate spacer 128 are exposed so that the inter-gate insulating layer 142 may be formed.

Then, after removing the hard mask pattern, the sacrifice gate, and the sacrifice gate insulating layer pattern, the gate insulating layer 124 may be formed on inner walls of the pair of gate spacers 128 and the first fin-type active region FA1. Then, after forming a conductive layer (not shown) that fills a space between the pair of gate spacers 128 on the gate insulating layer 124, an upper portion of the conductive layer is etched back so that the gate electrode GL may be formed. Then, after forming an insulating layer (not shown) that fills a residual portion between the pair of gate spacers 128 on the gate electrode GL and the inter-gate insulating layer 142, an upper portion of the insulating layer is removed until a top surface of the inter-gate insulating layer 142 or the gate spacer 128 is exposed so that the gate capping layer 126 may be formed. Therefore, the gate structure GS including the gate electrode GL, the gate insulating layer 124, the gate capping layer 126, and the gate spacer 128 may be formed.

Then, the first interlayer insulating layer 144 may be formed on the gate structure GS and the inter-gate insulating layer 142.

Figure 10:
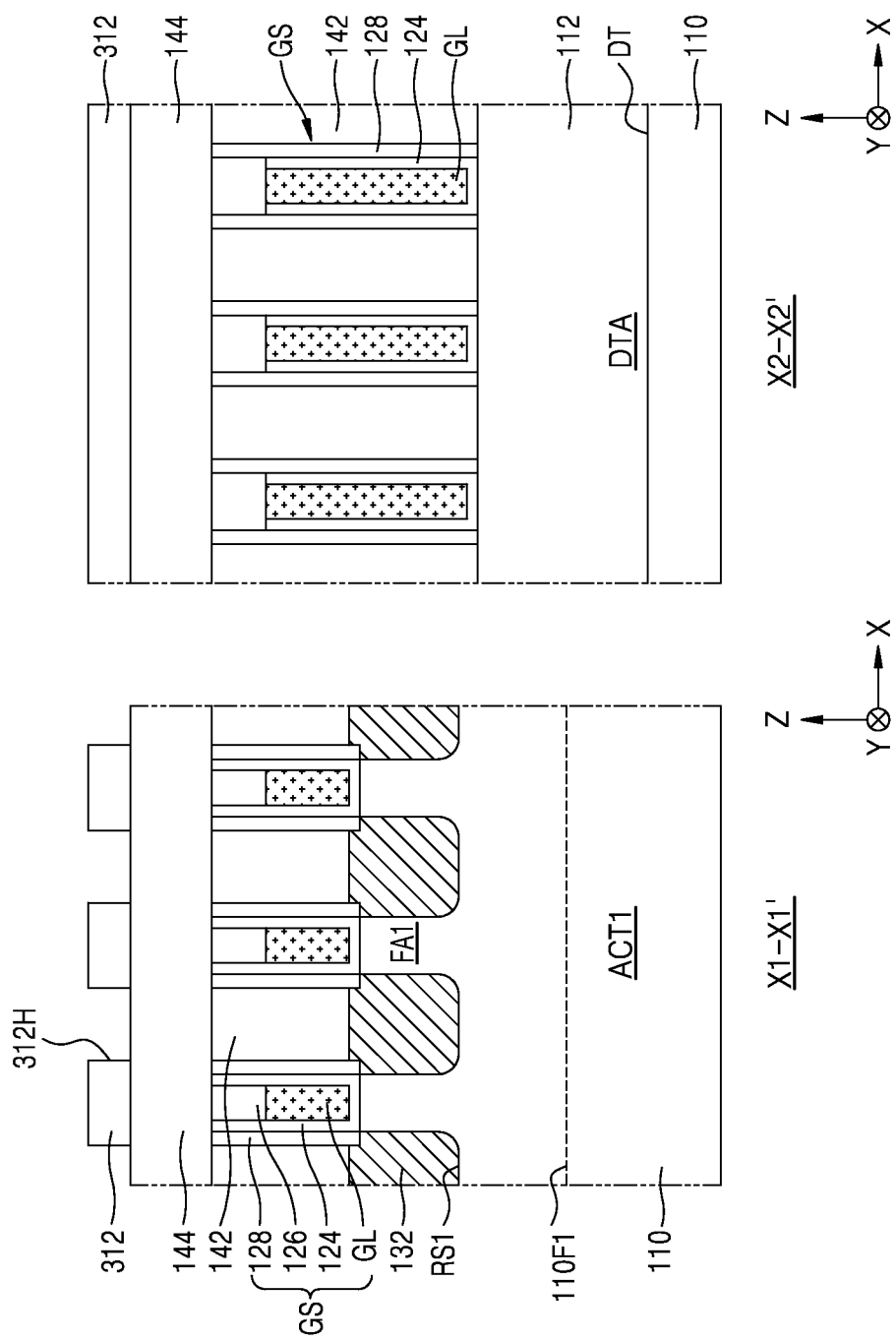

Referring to FIG. 10, a first mask pattern 312 including a plurality of first openings 312H may be formed on the first interlayer insulating layer 144. For example, the plurality of first openings 312H may vertically overlap the first source/drain region 132, and a width of each of the plurality of first openings 312H in the first direction (the X direction) may be greater than a width of each of the plurality of first openings 312H in the second direction (the Y direction).

Figure 11:
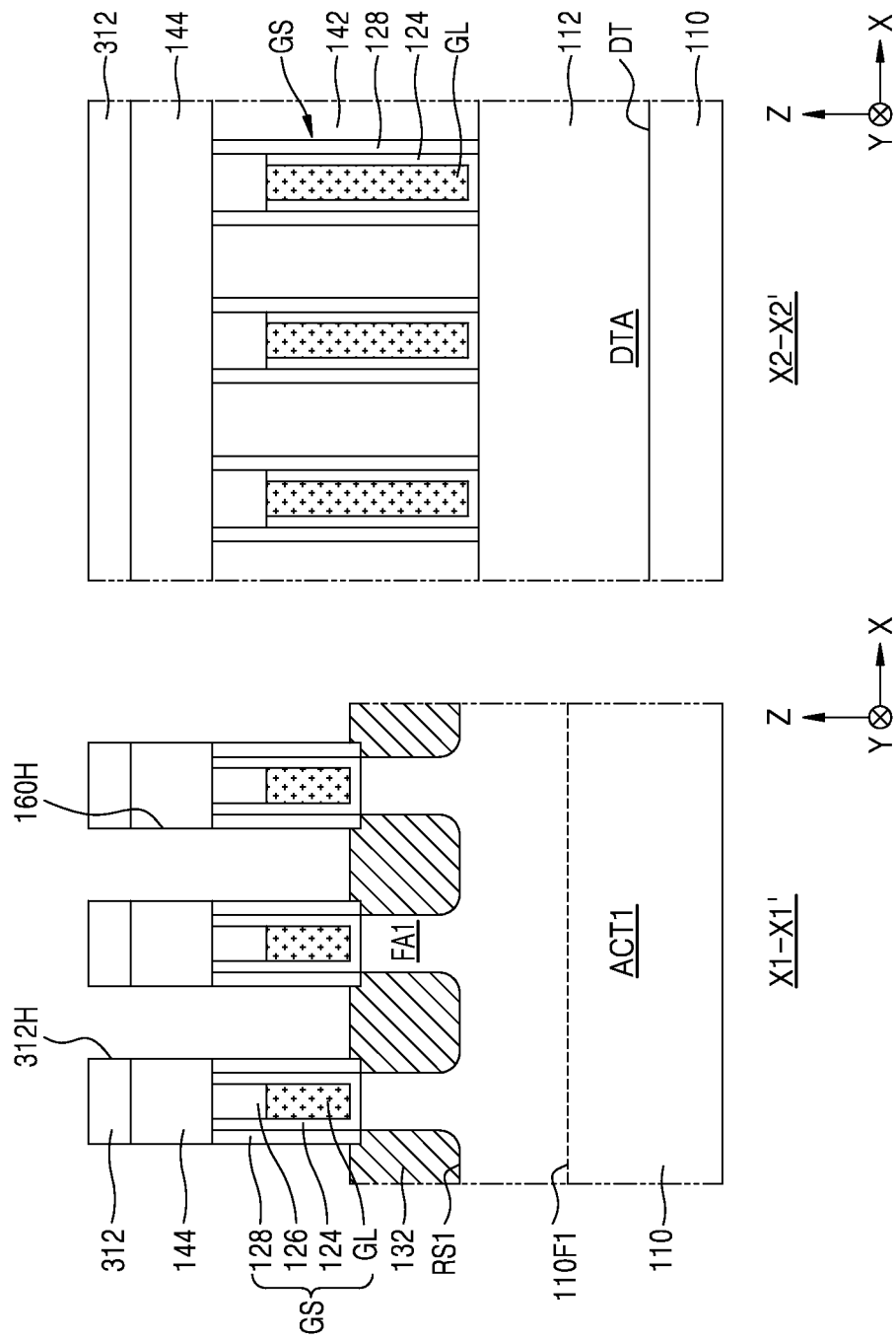

Referring to FIG. 11, a second contact hole 160H may be formed by removing the first interlayer insulating layer 144 and the inter-gate insulating layer 142 by using the first mask pattern 312 as the etching mask. A top surface of the first source/drain region 132 may be exposed at a bottom portion of the second contact hole 160H. An outer wall of the gate spacer 128 may be exposed by two side walls apart from each other in the X direction of the second contact hole 160H.

Figure 12:
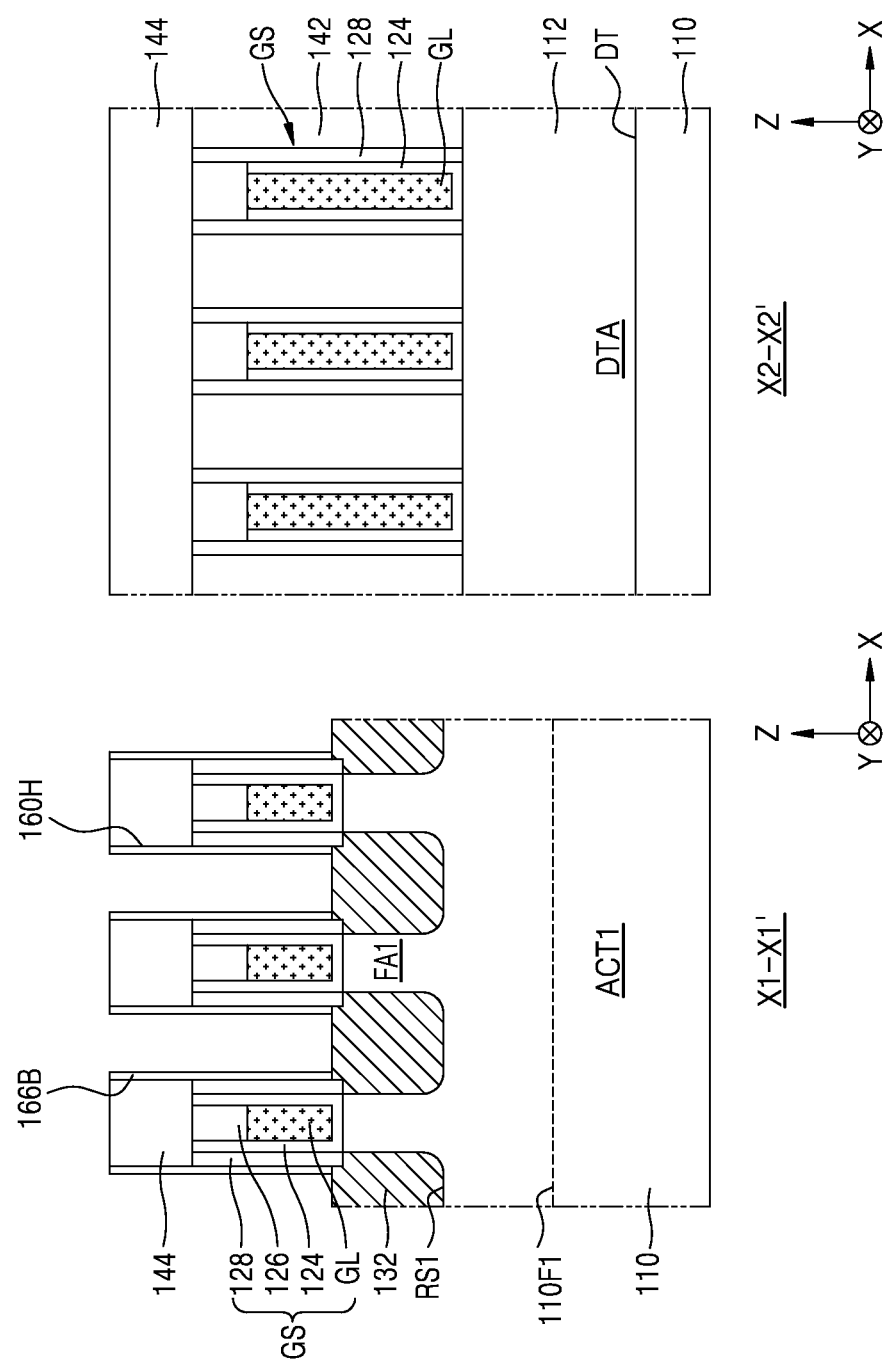

Referring to FIG. 12, a top surface of the first interlayer insulating layer 144 may be exposed again by removing the first mask pattern 312 (refer to FIG. 11).

Then, an insulating layer (not shown) is formed on an inner wall of the second contact hole 160H and the first interlayer insulating layer 144, and an anisotropic etching process is performed on the insulating layer so that the second insulating liner 166B may reside on the side wall of the second contact hole 160H. The top surface of the first source/drain region 132 may be exposed again by the anisotropic etching process.

Figure 13:
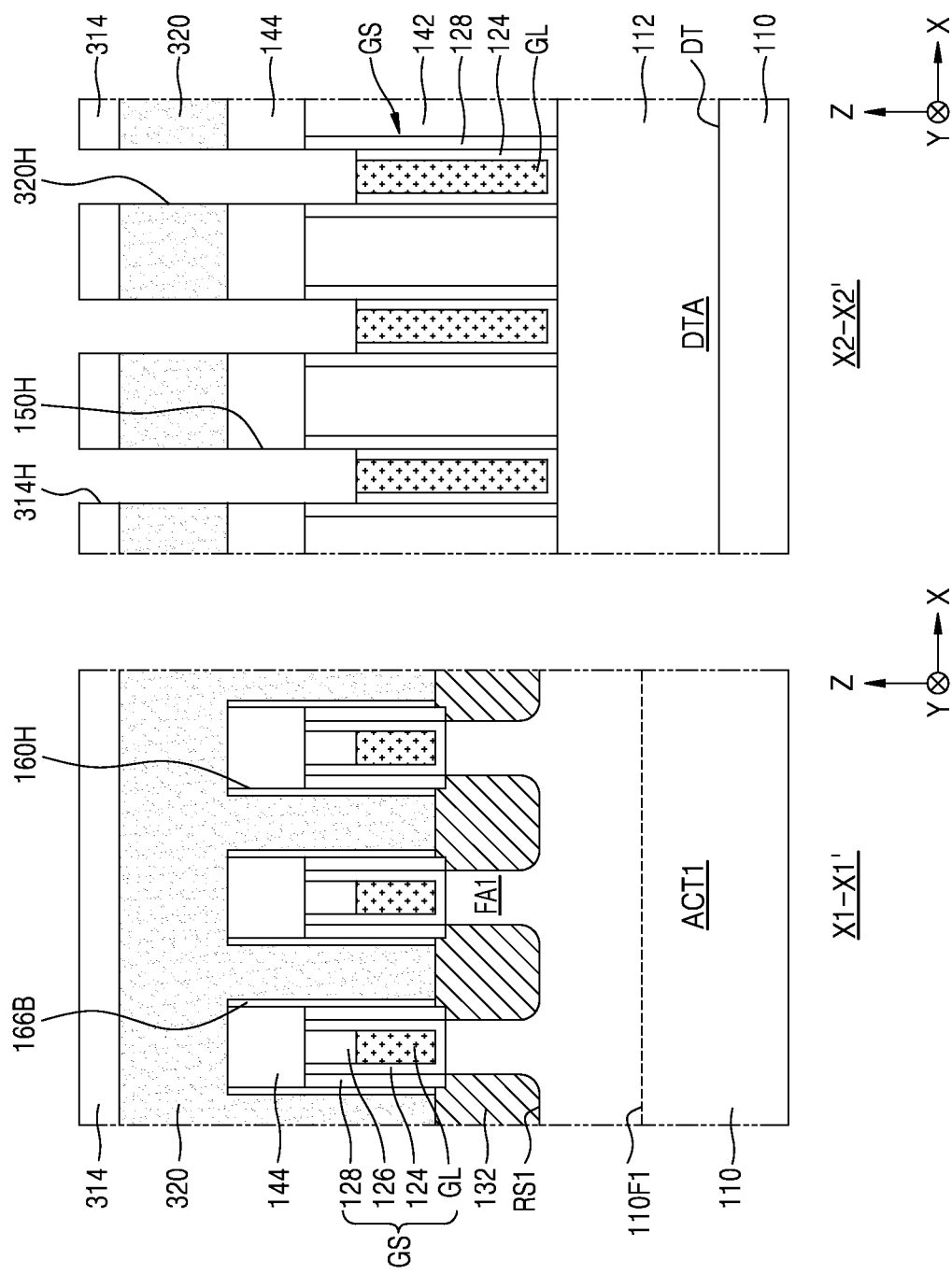

Referring to FIG. 13, the buried insulating layer 320 may be formed on the inner wall of the second contact hole 160H and the first interlayer insulating layer 144. For example, the buried insulating layer 320 may include a spin-on hardmask (SOH). However, the inventive concept is not limited thereto. The buried insulating layer 320 may fill the inside of the second contact hole 160H.

Then, a second mask pattern 314 including a plurality of second openings 314H may be formed on the buried insulating layer 320. For example, the plurality of second openings 314H may vertically overlap the gate structure GS on the deep trench region DTA.

Then, a buried insulating layer opening 320H may be formed by removing a part of the buried insulating layer 320 by using the second mask pattern 314 as an etching mask.

The first contact hole 150H may be formed by sequentially removing the first interlayer insulating layer 144 and the gate capping layer 126 by using the buried insulating layer 320 as an etching mask. The top surface of the gate electrode GL may be exposed to a bottom portion of the first contact hole 150H, and the inner wall of the gate spacer 128 may be exposed by the two side walls apart from each other in the X direction of the first contact hole 150H.

Then, the second mask pattern 314 may be removed.

Figure 14:
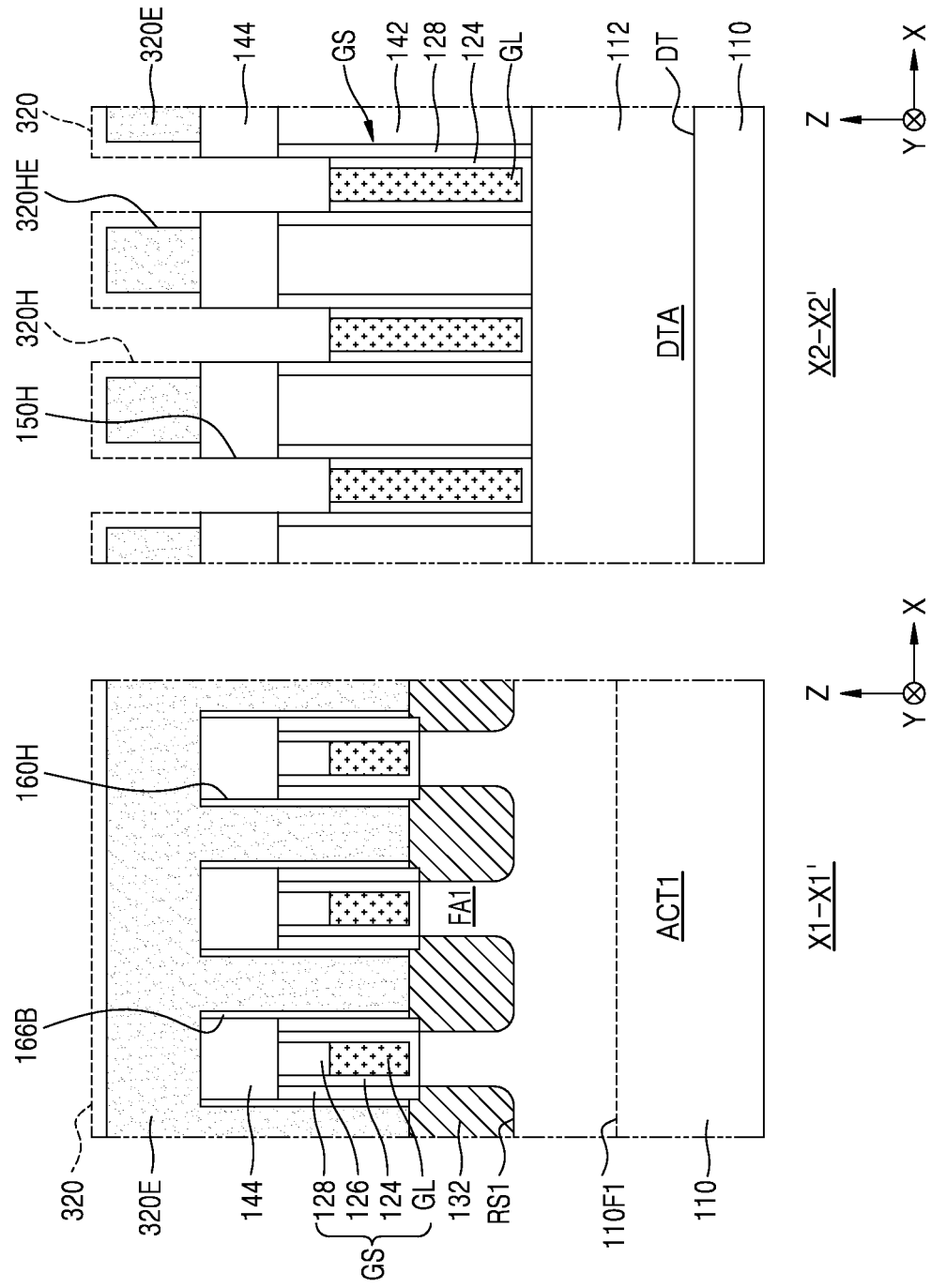

Referring to FIG. 14, the pulled-back buried insulating layer 320E may be formed by performing the pull-back process on the buried insulating layer 320.

In exemplary embodiments, in the pull-back process, a region to a partial thickness is removed from a surface of the buried insulating layer 320. For comparison, in FIG. 14, a top surface and side walls of the buried insulating layer 320 before the pull-back process are schematically illustrated in a dotted line.

After the pull-back process, a part of a top surface of the first interlayer insulating layer 144 adjacent to the first contact hole 150H may be exposed without being covered with the pulled-back buried insulating layer 320E. For example, the buried insulating layer 320 may be removed to a thickness of about 1 to 10 nm by the pull-back process. In addition, the buried insulating layer opening 320H may expand laterally by the pull-back process, and an expanded buried insulating layer opening 320HE may be formed.

Figure 15:
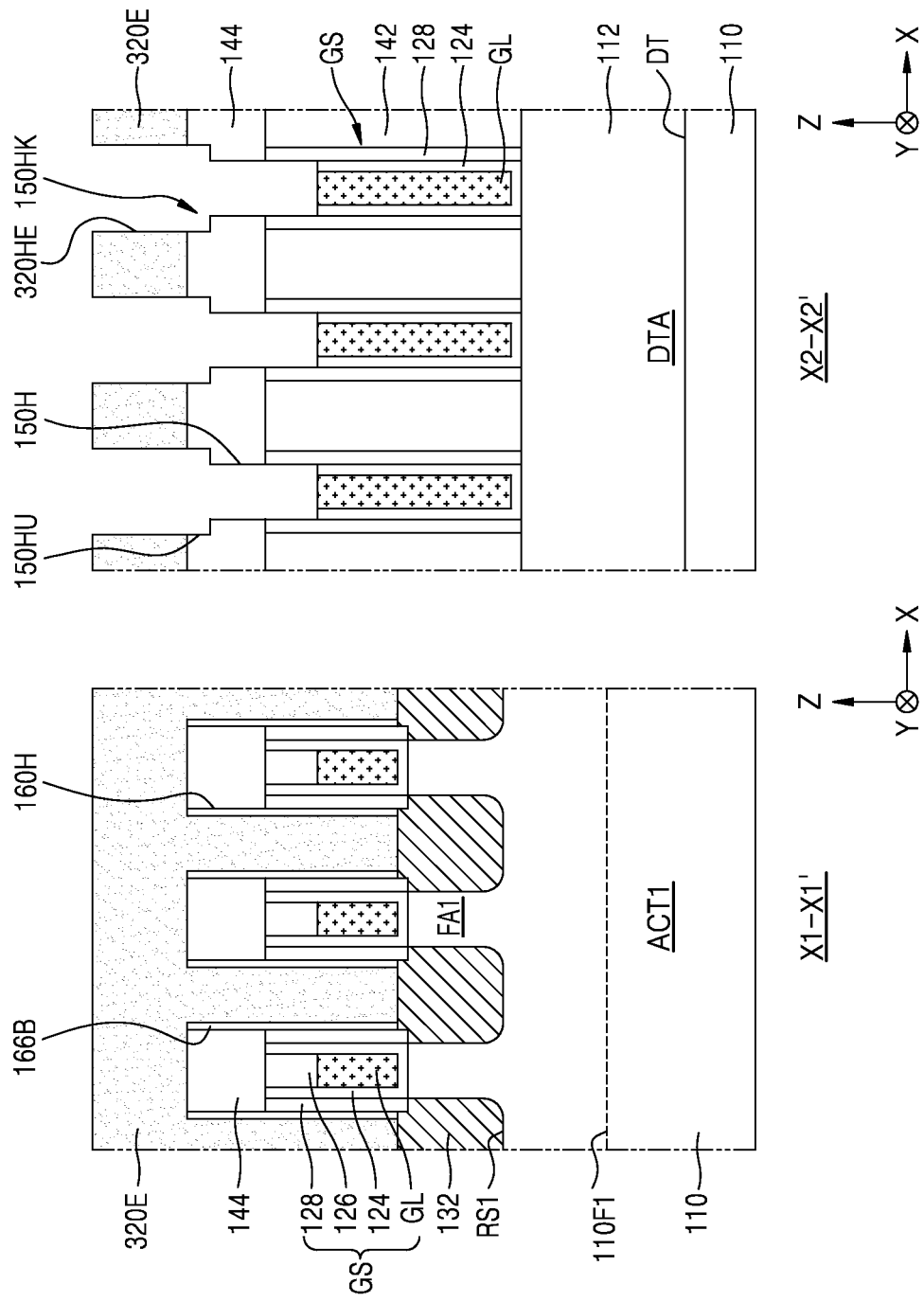

Referring to FIG. 15, the expanded upper region 150HU may be formed by removing a part from the top surface of the first contact hole 150H by using the pulled-back buried insulating layer 320E as an etching mask. The expanded upper region 150HU may have a side wall aligned with a side wall of the expanded buried insulating layer opening 320HE. A bottom portion of the expanded upper region 150HU may be disposed at a higher level than that of a bottom surface of the first interlayer insulating layer 144.

The first contact hole 150H may include the step 150HK at the same level as that of the bottom portion of the expanded upper region 150HU. The step 150HK may be formed by an exposed top surface of the first interlayer insulating layer 144 in the bottom portion of the expanded upper region 150HU and may refer to a region in which a slope of the side wall of the first contact hole 150H rapidly changes.

Figure 16:
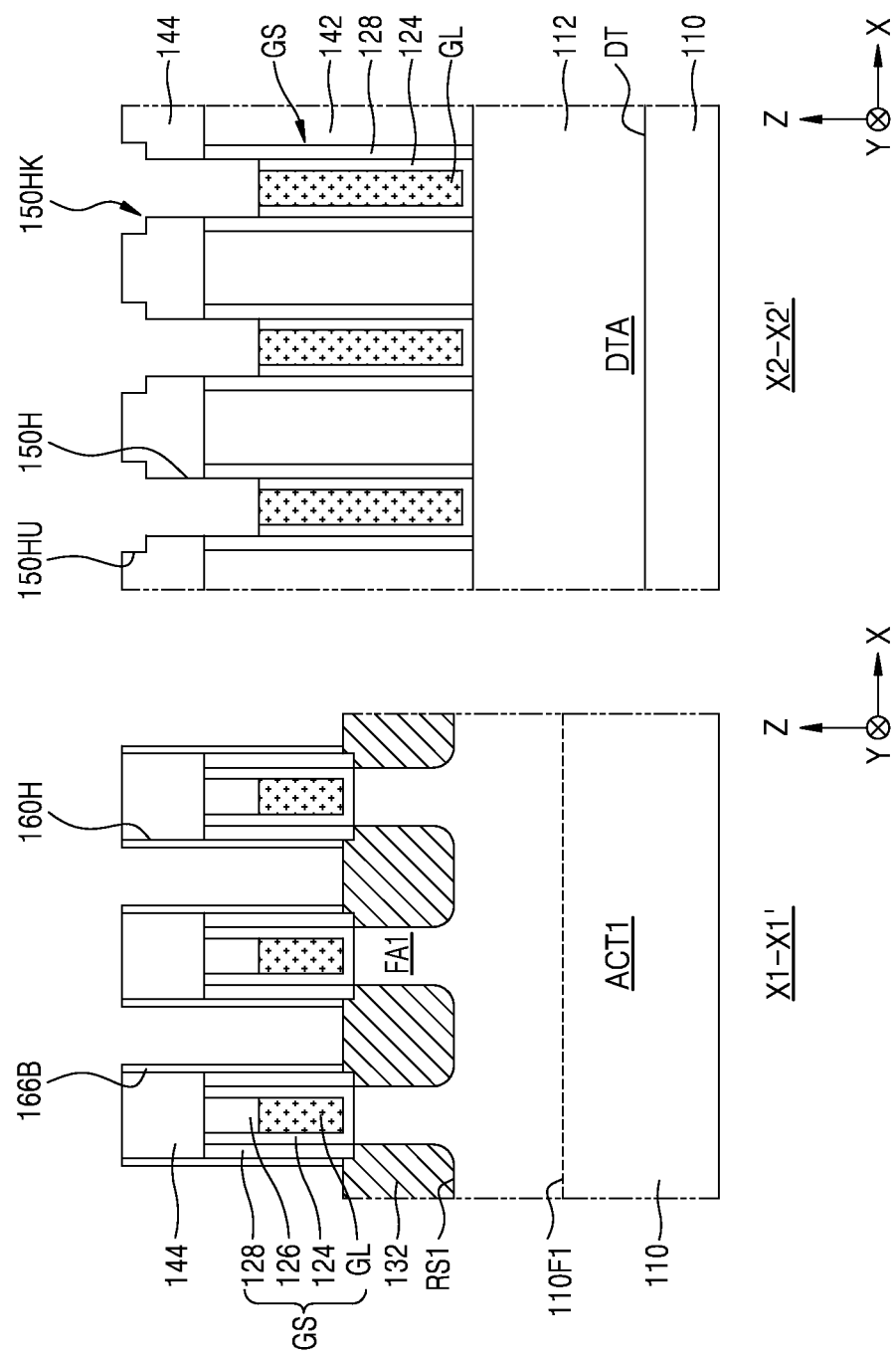

Referring to FIG. 16, the pulled-back buried insulating layer 320E (refer to FIG. 15) may be removed.

As the pulled-back buried insulating layer 320E is removed, the top surface of the first source/drain region 132 and a side wall of the second insulating liner 166B that are covered with the pulled-back buried insulating layer 320E in the second contact hole 160H may be exposed again.

Figure 17:
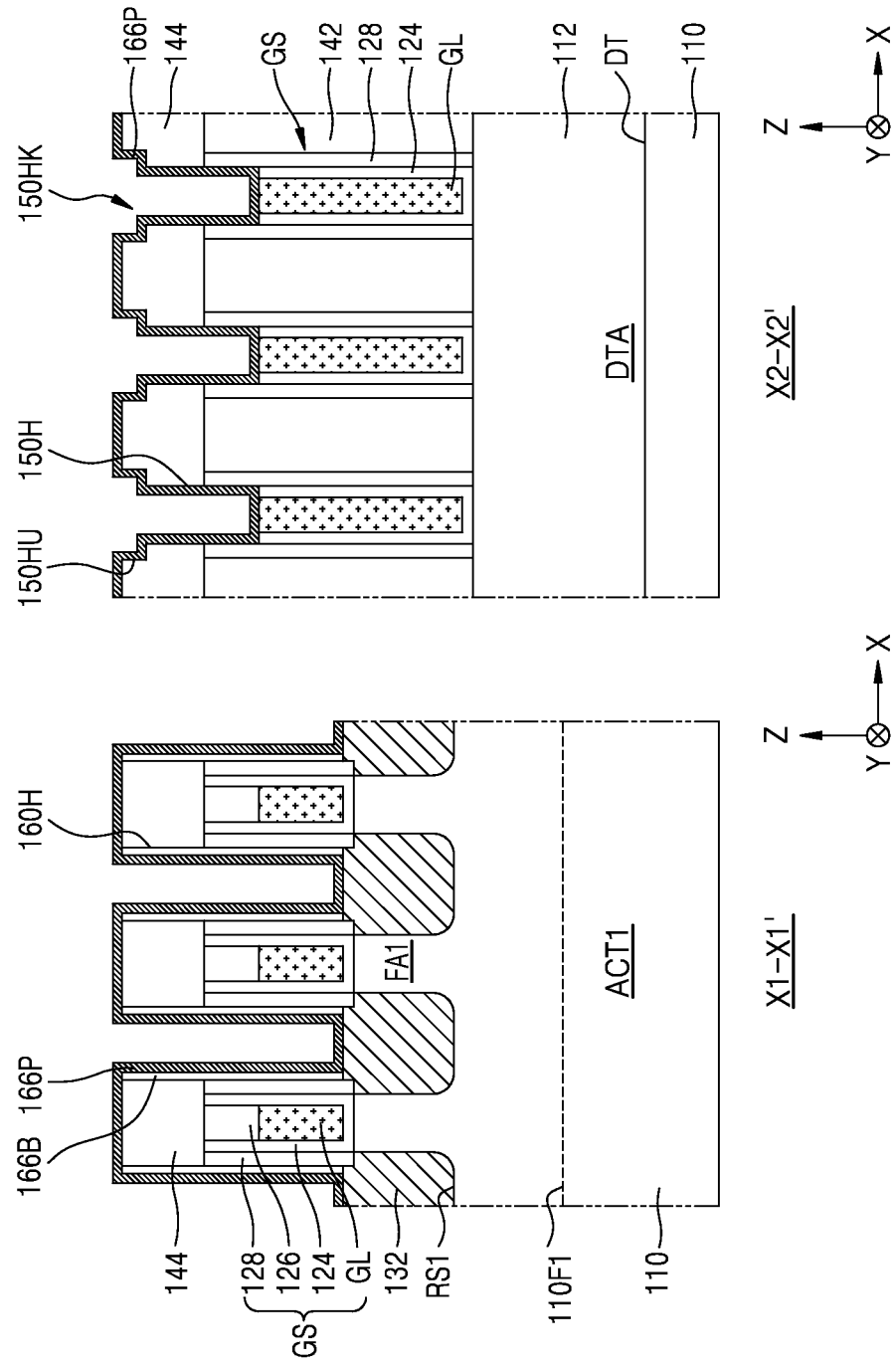

Referring to FIG. 17, an insulating liner layer 166P may be formed on the first interlayer insulating layer 144. The insulating liner layer 166P may be conformally formed on the inner wall of the first contact hole 150H and the inner wall of the second contact hole 160H. The insulating liner layer 166P may be formed to a predetermined thickness along side wall profiles of the expanded upper region 150HU and the step 150HK.

In exemplary embodiments, the insulating liner layer 166P may be formed by an atomic layer deposition (ALD) process or the CVD process by using at least one of silicon nitride, silicon oxy-nitride, silicon oxycarbonitride, and silicon oxide.

Figure 18:
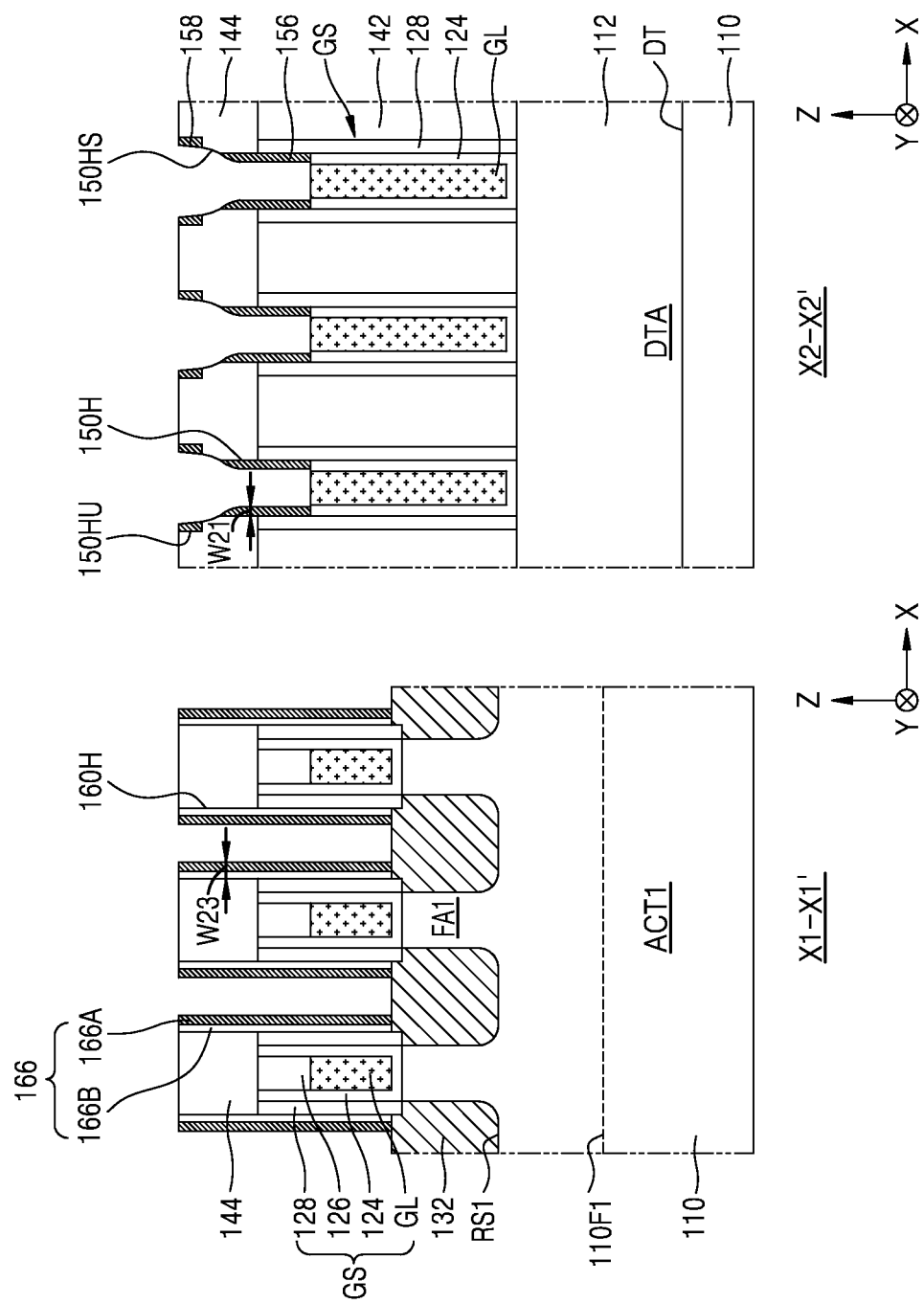

Referring to FIG. 18, the side wall rounding process may be performed on the insulating liner layer 166P. For example, the side wall rounding process may include a dry etching process using a fluorine-based etching gas. For example, the side wall rounding process may be performed at a pressure of about 10 mTorr to about 100 Torr at an etching atmosphere including at least one of a fluorine-based etching gas, Argon (Ar), and oxygen (O). However, the inventive concept is not limited thereto.

The step 150HK (refer to FIG. 17) is removed by the side wall rounding process and a side wall 150HS of the first contact hole 150H may have a gradually-sloped profile. This is because, in the side wall rounding process, the first interlayer insulating layer 144 adjacent to the step 150HK may be exposed to or collide with a greater amount of etching gases so that a greater amount of the first interlayer insulating layer 144 adjacent to the step 150HK is removed. For example, after the side wall rounding process, an upper width of the first contact hole 150H may be greater than a lower width of the first contact hole 150H.

As the step 150HK is removed by the side wall rounding process, a part of the insulating liner layer 166P disposed on the step 150HK may be removed together with the step 150HK. Therefore, the upper insulating liner 158 resides on the inner wall of the expanded upper region 150HU, and the lower insulating liner 156 may reside on a lower portion of the side wall 150HS of the first contact hole 150H. At a level lower than that of a bottom surface of the upper insulating liner 158 and higher than that of a top surface of the lower insulating liner 156, the side wall 150HS of the first contact hole 150H has a rounded profile gradually connected and expanding upward.

The insulating liner layer 166P on the top surface of the gate electrode GL is removed by the side wall rounding process so that the top surface of the gate electrode GL may be exposed. In addition, the insulating liner layer 166P on the top surface of the first source/drain region 132 is removed by the side wall rounding process in the bottom portion of the second contact hole 160H. The top surface of the first source/drain region 132 may be exposed. The first insulating liner 166A may reside on the side wall of the second contact hole 160H. The first insulating liner 166A and the second insulating liner 166B that are disposed in the second contact hole 160H may be referred to as the liner structure 166.

Figure 19:
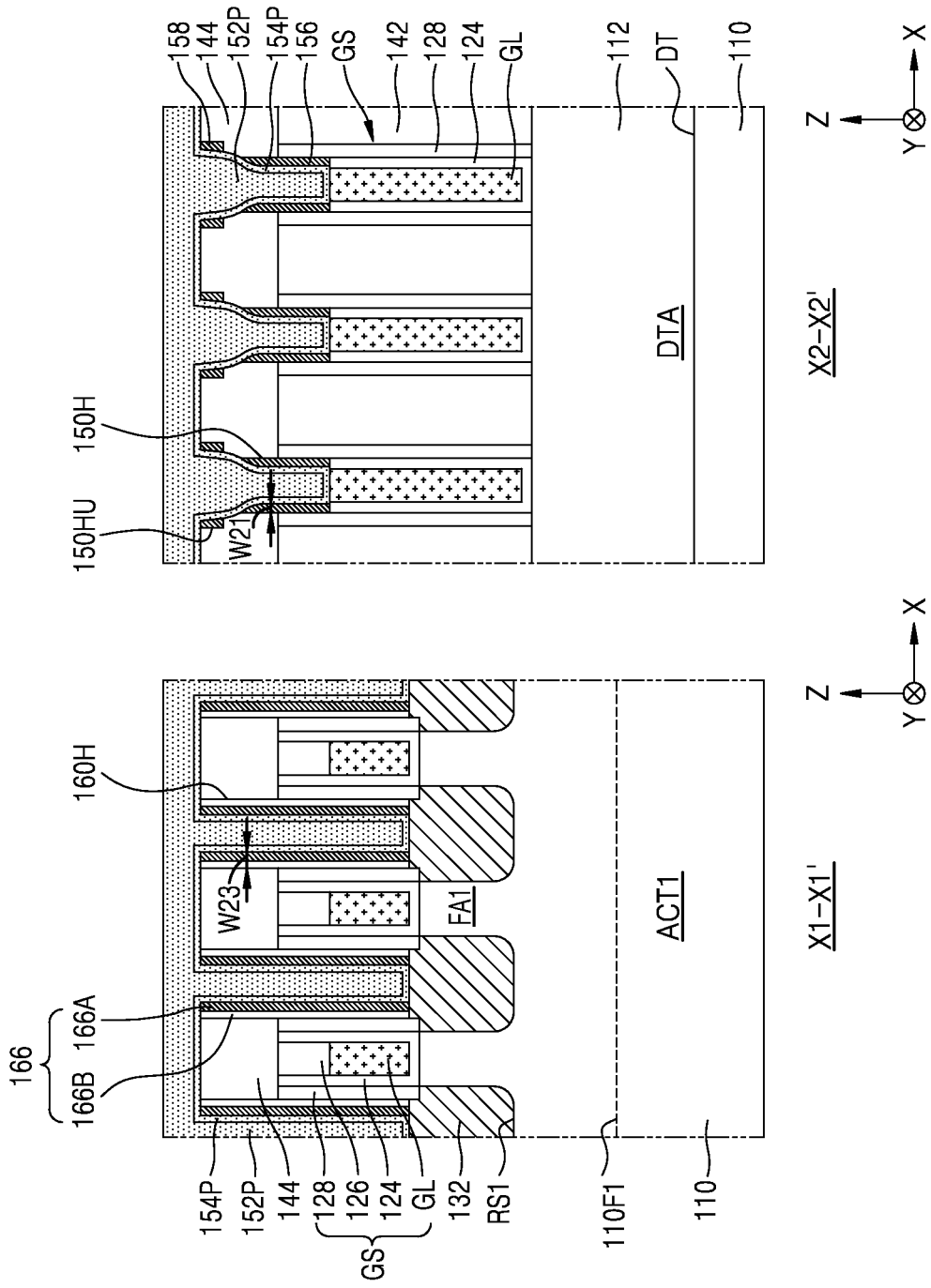

Referring to FIG. 19, a barrier layer 154P and a conductive layer 152P may be sequentially formed on the inner walls of the first contact hole 150H and the second contact hole 160H.

As the side wall 150HS (refer to FIG. 18) of the first contact hole 150H has a rounded profile gradually connected and expanding upward, it is possible to prevent a void from being formed in the process of filling the inside of the first contact hole 150H with the metal material.

Figure 20:
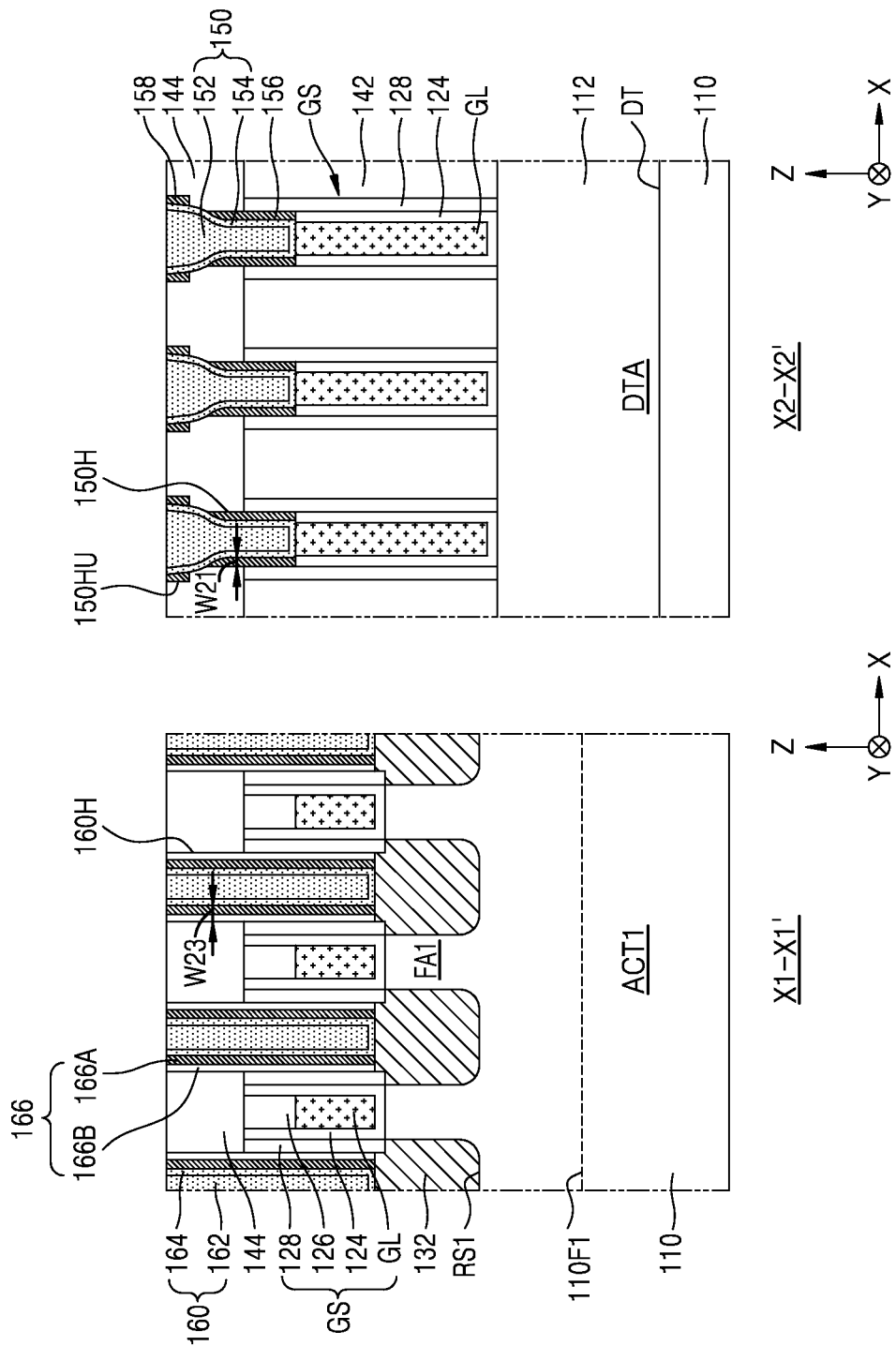

Referring to FIG. 20, top portions of the barrier layer 154P and top portions of the conductive layer 152P are removed until the top surface of the first interlayer insulating layer 144 is exposed so that the first contact structure 150 may reside in the first contact hole 150H and the second contact structure 160 may reside in the second contact hole 160H. At this time, the barrier layer 154P in the first contact hole 150H may be referred to as the first conductive barrier 154 and the barrier layer 154P in the second contact hole 160H may be referred to as the second conductive barrier 164. The conductive layer 152P in the first contact hole 150H may be referred to as the first contact plug 152, and the conductive layer 152P in the second contact hole 160H may be referred to as the second contact plug 162.

Referring to FIG. 2 again, the etch stop layer 168 and the second interlayer insulating layer 170 may be sequentially formed on the first contact structure 150, the second contact structure 160, and the first interlayer insulating layer 144.

A first via hole 172H that exposes the top surface of the first contact structure 150 and a second via hole 174H that exposes the top surface of the second contact structure 160 may be formed by removing parts of the second interlayer insulating layer 170 and the etch stop layer 168. Then, the via barrier layers 172B and 174B are formed on inner walls of the first via hole 172H and the second via hole 174H, and the via conductive layers 172P and 174P that fill the first via hole 172H and the second via hole 174H may be formed.

The integrated circuit device 100 may be completed by performing the above-described process.

In general, since a width of the first contact structure 150 is relatively small and a height of the first contact structure 150 is relatively large, in the process of filling the inside of the first contact hole 150H with the metal material, the first contact hole 150H may not be completely filled. In such a case, a void may be formed in the first contact structure 150 and resistance of the first contact structure 150 increases so that the electrical characteristic of the integrated circuit device 100 may deteriorate.

However, according to the above-described exemplary embodiments, the expanded upper region 150HU is formed by the pull-back process of the buried insulating layer 320 and the side wall rounding process is performed on the insulating liner layer 166P so that the first contact structure 150 having an increased upper width and the gradually-sloped side wall profile may be formed. Therefore, in the process of filling the metal material to form the first contact structure 150, it is possible to prevent a void from being formed and the integrated circuit device 100 including the first contact structure 150 may have a high electrical characteristic.

On the other hand, after performing the processes described with reference to FIGS. 9 to 12, the second contact structure 160 that fills a residual portion of the second contact hole 160H may be first formed on the second insulating liner 166B. Then, the third interlayer insulating layer 146 and the buried insulating layer 320 may be sequentially formed on the second contact structure 160 and the first interlayer insulating layer 144. In such a case, the integrated circuit device 100A described with reference to FIG. 5 may be manufactured.

In addition, in the processes described with reference to FIGS. 9 to 12, in the etching process of forming the second contact hole 160H, a second portion (that is, a portion corresponding to the second portion 250_2 of the third contact structure 250) of the third contact hole 250H may be formed together with the second contact hole 160H. Then, in the etching process of forming the first contact hole 150H, a first portion (that is, a portion corresponding to the first portion 250_1 of the third contact structure 250) of the third contact hole 250H may be formed together with the first contact hole 150H. In such a case, the integrated circuit device 200A described with reference to FIGS. 7 and 8 may be manufactured.

While the inventive concept has been particularly shown and described with reference to embodiments thereof, it will be understood that various changes in form and details may be made therein without departing from the spirit and scope of the following claims.

What is claimed is:

1. A device comprising:
a substrate including a first region, a second region and a third region that is disposed between the first region and the second region;
a first fin disposed on the first region of the substrate;
a second fin disposed on the first region of the substrate;
a third fin disposed on the first region of the substrate;
a fourth fin disposed on the second region of the substrate;
a fifth fin disposed on the second region of the substrate;
a sixth fin disposed on the second region of the substrate;
a first isolation disposed on the first region of the substrate, and disposed between the first fin and the second fin;
a second isolation disposed on the first region of the substrate, and disposed between the second fin and the third fin;
a third isolation disposed on the substrate, and disposed between the third fin and the fourth fin;
a fourth isolation disposed on the second region of the substrate, and disposed between the fourth fin and the fifth fin;
a fifth isolation disposed on the second region of the substrate, and disposed between the fifth fin and the sixth fin;
a first gate disposed on the first through sixth fins and on the first through fifth isolations;
a second gate disposed on the first through sixth fins and on the first through fifth isolations;
a first epitaxial source/drain disposed on the first fin, and disposed between the first gate and the second gate;
a second epitaxial source/drain disposed on the second fin, and disposed between the first gate and the second gate;
a third epitaxial source/drain disposed on the third fin, and disposed between the first gate and the second gate;
a fourth epitaxial source/drain disposed on the fourth fin, and disposed between the first gate and the second gate;
a fifth epitaxial source/drain disposed on the fifth fin, and disposed between the first gate and the second gate;
a sixth epitaxial source/drain disposed on the sixth fin, and disposed between the first gate and the second gate;
a first contact disposed on the first gate;
a second contact disposed on the second gate;
a lower insulating liner disposed on a lower portion of a sidewall of the first contact; and
an upper insulating liner disposed on an upper portion of the sidewall of the first contact,
wherein a width of an upper portion of the first contact is greater than a width of a lower portion of the first contact, and
the lower insulating liner is spaced apart from the upper insulating liner.

2. The device of claim 1, wherein a width of an upper part of the lower insulating liner is less than a width of a lower part of the lower insulating liner.

3. The device of claim 1, wherein a width of an upper part of the upper insulating liner is less than a width of a lower part of the upper insulating liner.

4. The device of claim 1, wherein a width of the third isolation is greater than a width of the second isolation, and is greater than a width of the fourth isolation.

5. The device of claim 1, wherein a depth of the third isolation is greater than a depth of the second isolation, and is greater than a depth of the fourth isolation.

6. The device of claim 1, further comprising:
a first insulating layer disposed on the third isolation; and
a second insulating layer disposed on the first insulating layer.

7. The device of claim 6, wherein each of the first insulating layer and the second insulating layer includes silicon oxy-nitride, silicon oxycarbonitride or silicon oxide.

8. The device of claim 6, wherein a bottom surface of the first insulating layer is rounded.

9. The device of claim 1, wherein the first, the second and the third epitaxial source/drains are merged, and
the fourth, the fifth and the sixth epitaxial source/drains are merged.

10. The device of claim 1, wherein further comprising:
a third contact disposed on the first, the second and the third source/drains; and
a fourth contact disposed on the fourth, the fifth and the sixth source/drains.

11. The device of claim 1, wherein a first pull-up transistor, a first pull-down transistor, a first pass transistor, a second pull-up transistor, a second pull-down transistor and a second pass transistor are formed at intersections where the first and the second gates meet the first through the sixth fins.

12. A device comprising:
a substrate including a first region, a second region and a third region that is disposed between the first region and the second region;
a first fin disposed on the first region of the substrate;
a second fin disposed on the first region of the substrate;
a third fin disposed on the first region of the substrate;
a fourth fin disposed on the second region of the substrate;
a fifth fin disposed on the second region of the substrate;
a sixth fin disposed on the second region of the substrate;
a first isolation disposed on the first region of the substrate, and disposed between the first fin and the second fin;
a second isolation disposed on the first region of the substrate, and disposed between the second fin and the third fin;
a third isolation disposed on the substrate, and disposed between the third fin and the fourth fin;
a fourth isolation disposed on the second region of the substrate, and disposed between the fourth fin and the fifth fin;
a fifth isolation disposed on the second region of the substrate, and disposed between the fifth fin and the sixth fin;
a first gate disposed on the first through sixth fins and on the first through fifth isolations;
a second gate disposed on the first through sixth fins and on the first through fifth isolations;
a first source/drain disposed on the first fin, and disposed between the first gate and the second gate;
a second source/drain disposed on the second fin, and disposed between the first gate and the second gate;
a third source/drain disposed on the third fin, and disposed between the first gate and the second gate;
a fourth source/drain disposed on the fourth fin, and disposed between the first gate and the second gate;
a fifth source/drain disposed on the fifth fin, and disposed between the first gate and the second gate;
a sixth source/drain disposed on the sixth fin, and disposed between the first gate and the second gate;
a first contact disposed on the first gate, and disposed above the third region of the substrate;
a second contact disposed on the second gate, and disposed above the third region of the substrate;
a third contact disposed on the first, the second and the third source/drains; and
a fourth contact disposed on the fourth, the fifth and the sixth source/drains,
wherein a width of an upper portion of the first contact is greater than a width of a lower portion of the first contact, and
a width of the third isolation is greater than a width of the second isolation, and is greater than a width of the fourth isolation.

13. The device of claim 12, further comprising:
a lower insulating liner disposed on a lower portion of a sidewall of the first contact; and
an upper insulating liner disposed on an upper portion of the sidewall of the first contact,
wherein the lower insulating liner does not contact the upper insulating liner.

14. The device of claim 12, wherein an upper surface of the third isolation is concavely rounded.

15. The device of claim 12, wherein a first pull-up transistor, a first pull-down transistor, a first pass transistor, a second pull-up transistor, a second pull-down transistor and a second pass transistor are formed at intersections where the first and the second gates meet the first through the sixth fins.

16. The device of claim 12, further comprising:
a first via connected to the first contact; and
a second via connected to the third contact.

17. A device comprising:
a substrate including a first region, a second region and a third region that is disposed between the first region and the second region;
a first fin disposed on the first region of the substrate;
a second fin disposed on the first region of the substrate;
a third fin disposed on the first region of the substrate;
a fourth fin disposed on the second region of the substrate;
a fifth fin disposed on the second region of the substrate;
a sixth fin disposed on the second region of the substrate;
a first isolation disposed on the first region of the substrate, and disposed between the first fin and the second fin;
a second isolation disposed on the first region of the substrate, and disposed between the second fin and the third fin;
a third isolation disposed on the substrate, and disposed between the third fin and the fourth fin;
a fourth isolation disposed on the second region of the substrate, and disposed between the fourth fin and the fifth fin;
a fifth isolation disposed on the second region of the substrate, and disposed between the fifth fin and the sixth fin;
a first gate disposed on the first through sixth fins and on the first through fifth isolations;
a second gate disposed on the first through sixth fins and on the first through fifth isolations;
a first source/drain disposed on the first fin, and disposed between the first gate and the second gate;
a second source/drain disposed on the second fin, and disposed between the first gate and the second gate;
a third source/drain disposed on the third fin, and disposed between the first gate and the second gate;
a fourth source/drain disposed on the fourth fin, and disposed between the first gate and the second gate;
a fifth source/drain disposed on the fifth fin, and disposed between the first gate and the second gate;
a sixth source/drain disposed on the sixth fin, and disposed between the first gate and the second gate;
a first contact disposed on the first gate;
a second contact disposed on the second gate;
a third contact disposed on the first, the second and the third source/drains; and
a fourth contact disposed on the fourth, the fifth and the sixth source/drains,
wherein a width of an upper portion of the first contact is greater than a width of a lower portion of the first contact, a depth of the third isolation is greater than a depth of the second isolation, and is greater than a depth of the fourth isolation, and the first, the second and the third source/drains are merged.

18. The device of claim 17, further comprising:

a lower insulating liner disposed on a lower portion of a sidewall of the first contact; and an upper insulating liner disposed on an upper portion of the sidewall of the first contact, and spaced apart from the lower insulating liner.

19. The device of claim 17, wherein a first pull-up transistor, a first pull-down transistor, a first pass transistor, a second pull-up transistor, a second pull-down transistor and a second pass transistor are formed at intersections where the first and the second gates meet the first through the sixth fins.

20. The device of claim 17, wherein the first region of the substrate is an active region for a p-type metal-oxide-semiconductor (PMOS) transistor, and the second region of the substrate is an active region for an n-type metal-oxide-semiconductor (NMOS) transistor.

* * * * *